(12) United States Patent
Hung et al.

(10) Patent No.: US 11,244,866 B2
(45) Date of Patent: Feb. 8, 2022

(54) LOW DIMENSIONAL MATERIAL DEVICE AND METHOD

(71) Applicant: Taiwan Semiconductor Manufacturing Co., Ltd., Hsinchu (TW)

(72) Inventors: Yi-Tse Hung, Hsinchu (TW); Chao-Ching Cheng, Hsinchu (TW); Tse-An Chen, Taoyuan (TW); Hung-Li Chiang, Taipei (TW); Lain-Jong Li, Hsinchu (TW); Tzu-Chiang Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/932,268

(22) Filed: Jul. 17, 2020

(65) Prior Publication Data

US 2021/0265501 A1 Aug. 26, 2021

Related U.S. Application Data

(60) Provisional application No. 62/981,749, filed on Feb. 26, 2020.

(51) Int. Cl.
*H01L 21/8234* (2006.01)
*H01L 29/78* (2006.01)
*H01L 21/306* (2006.01)
*H01L 21/28* (2006.01)
*H01L 29/06* (2006.01)
(Continued)

(52) U.S. Cl.
CPC ............... *H01L 21/823437* (2013.01); *H01L 21/02568* (2013.01); *H01L 21/28132* (2013.01); *H01L 21/30604* (2013.01); *H01L 29/0649* (2013.01); *H01L 29/0669* (2013.01); *H01L 29/785* (2013.01); *H01L 29/7831* (2013.01); *B82Y 40/00* (2013.01)

(58) Field of Classification Search
None
See application file for complete search history.

(56) References Cited

U.S. PATENT DOCUMENTS 6,858,483 B2  2/2005  Doczy et al.
8,603,880 B2  12/2013  Yamada
(Continued)

FOREIGN PATENT DOCUMENTS

KR  20170004828 A  1/2017

OTHER PUBLICATIONS

Beesley et al.,"Sub-15-nm patterning of asymmetric metal electrodes and devices by adhesion lithography," Nature Communications, vol. 5, May 27, 2014, 9 pages.

*Primary Examiner* — Cheung Lee
(74) *Attorney, Agent, or Firm* — Slater Matsil, LLP

(57) ABSTRACT

In an embodiment, a device includes: a dielectric fin on a substrate; a low-dimensional layer on the dielectric fin, the low-dimensional layer including a source/drain region and a channel region; a source/drain contact on the source/drain region; and a gate structure on the channel region adjacent the source/drain contact, the gate structure having a first width at a top of the gate structure, a second width at a middle of the gate structure, and a third width at a bottom of the gate structure, the second width being less than each of the first width and the third width.

20 Claims, 26 Drawing Sheets

(51) Int. Cl.
*H01L 21/02* (2006.01)
*B82Y 40/00* (2011.01)

(56) References Cited

U.S. PATENT DOCUMENTS

| | | |
|---|---|---|
| 2015/0206974 A1* | 7/2015 | Lim .................. H01L 29/66818 257/288 |
| 2016/0190233 A1 | 6/2016 | Chang et al. |
| 2017/0005165 A1 | 1/2017 | Chen et al. |
| 2017/0098717 A1 | 4/2017 | Yeh et al. |

* cited by examiner

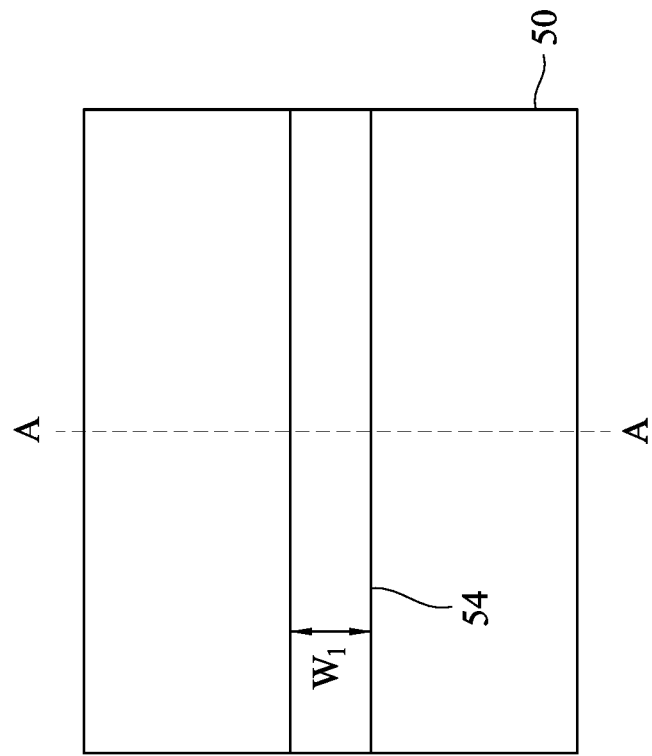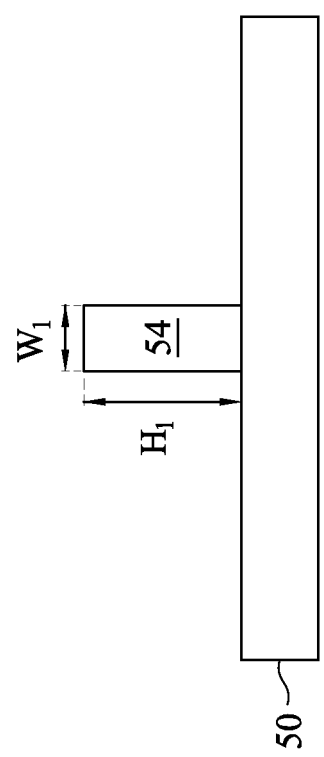

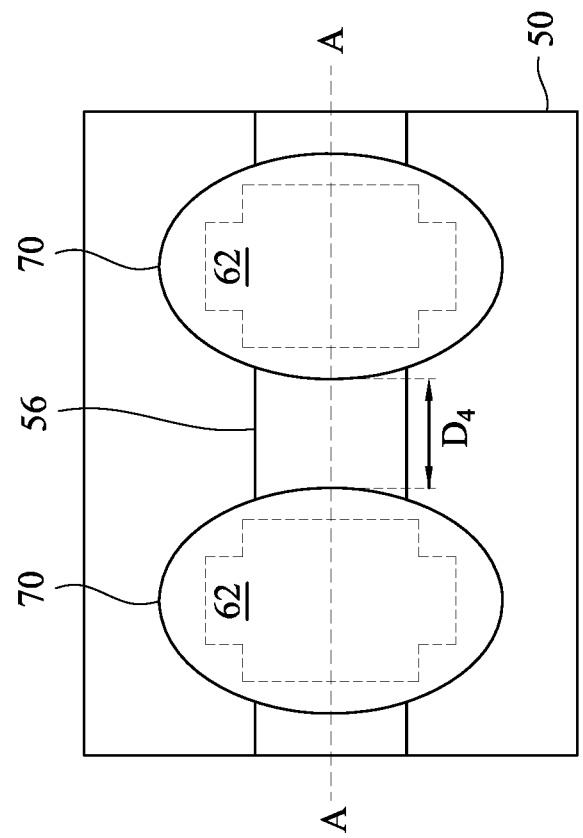
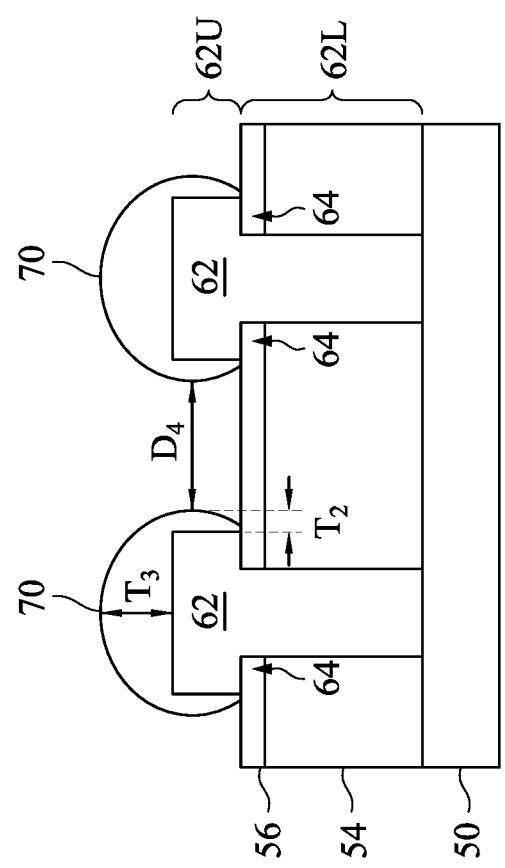
Fig. 11A
Fig. 11B

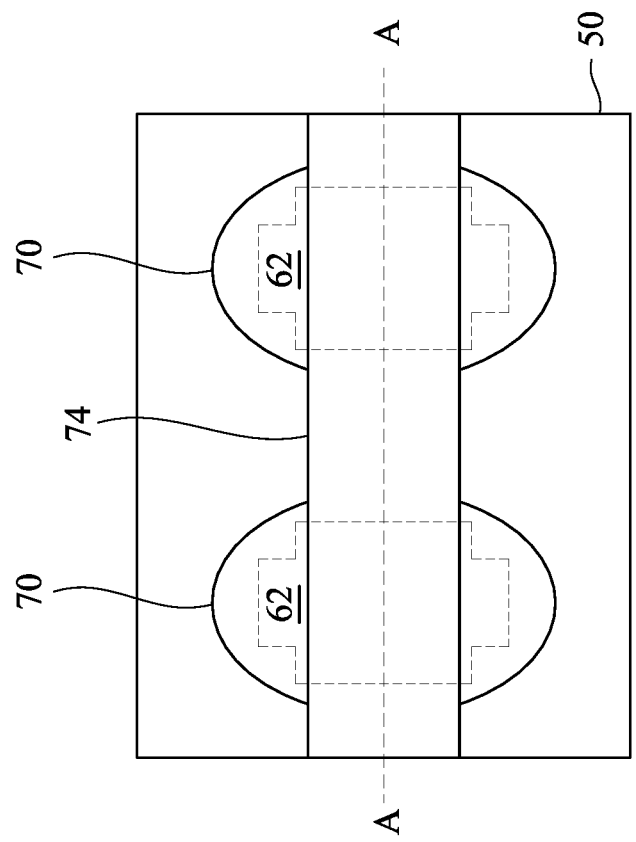
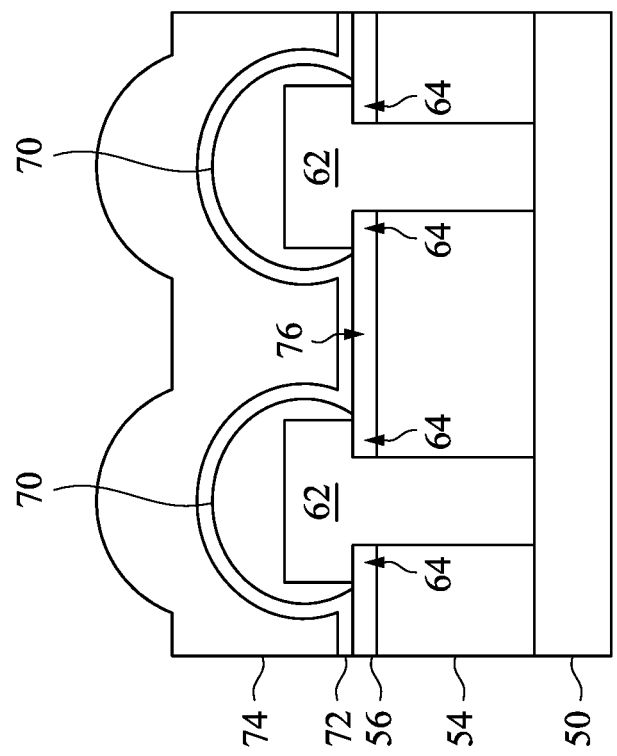
Fig. 12A
Fig. 12B

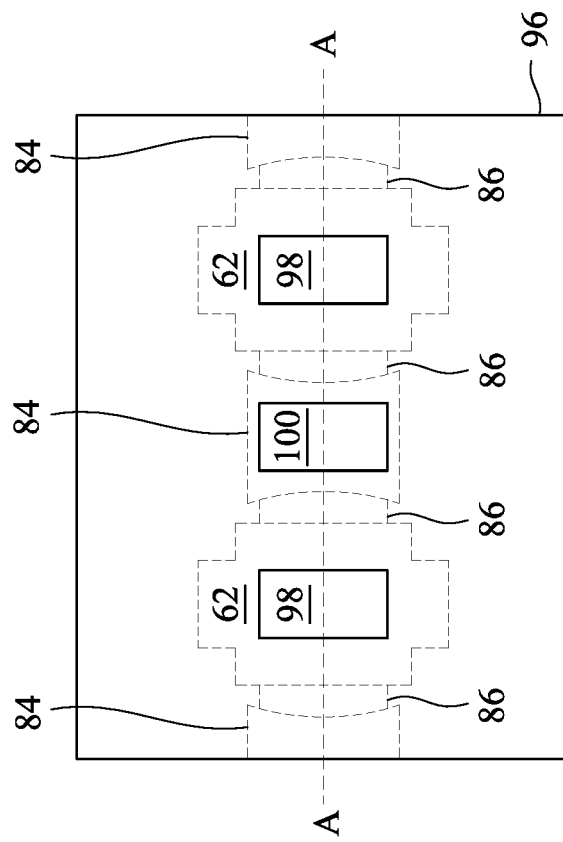
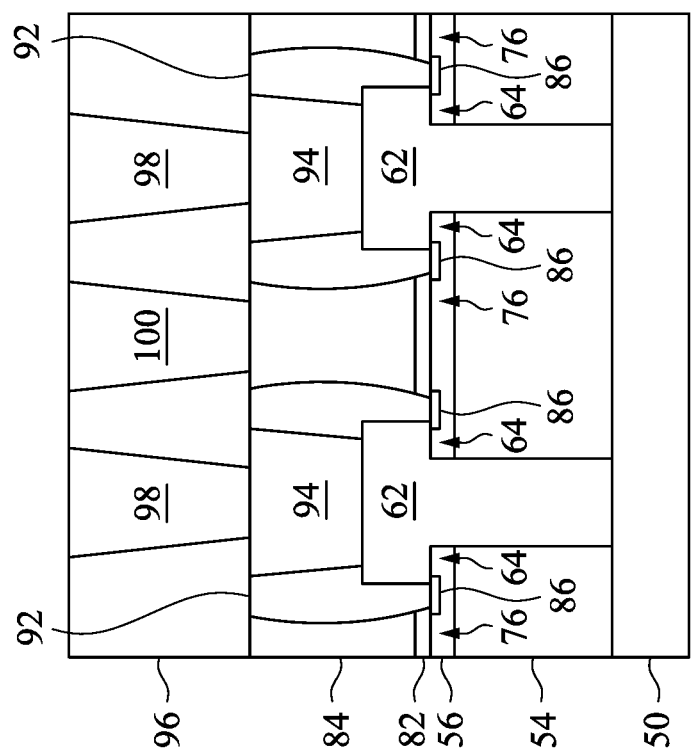
Fig. 18B
Fig. 18A

LOW DIMENSIONAL MATERIAL DEVICE AND METHOD

PRIORITY CLAIM AND CROSS-REFERENCE

This application claims the benefit of U.S. Provisional Application No. 62/981,749, filed on Feb. 26, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A through 18D are various views of intermediate stages in the manufacturing of low-dimensional FinFETs, in accordance with some embodiments.

DETAILED DESCRIPTION

Figure 1:
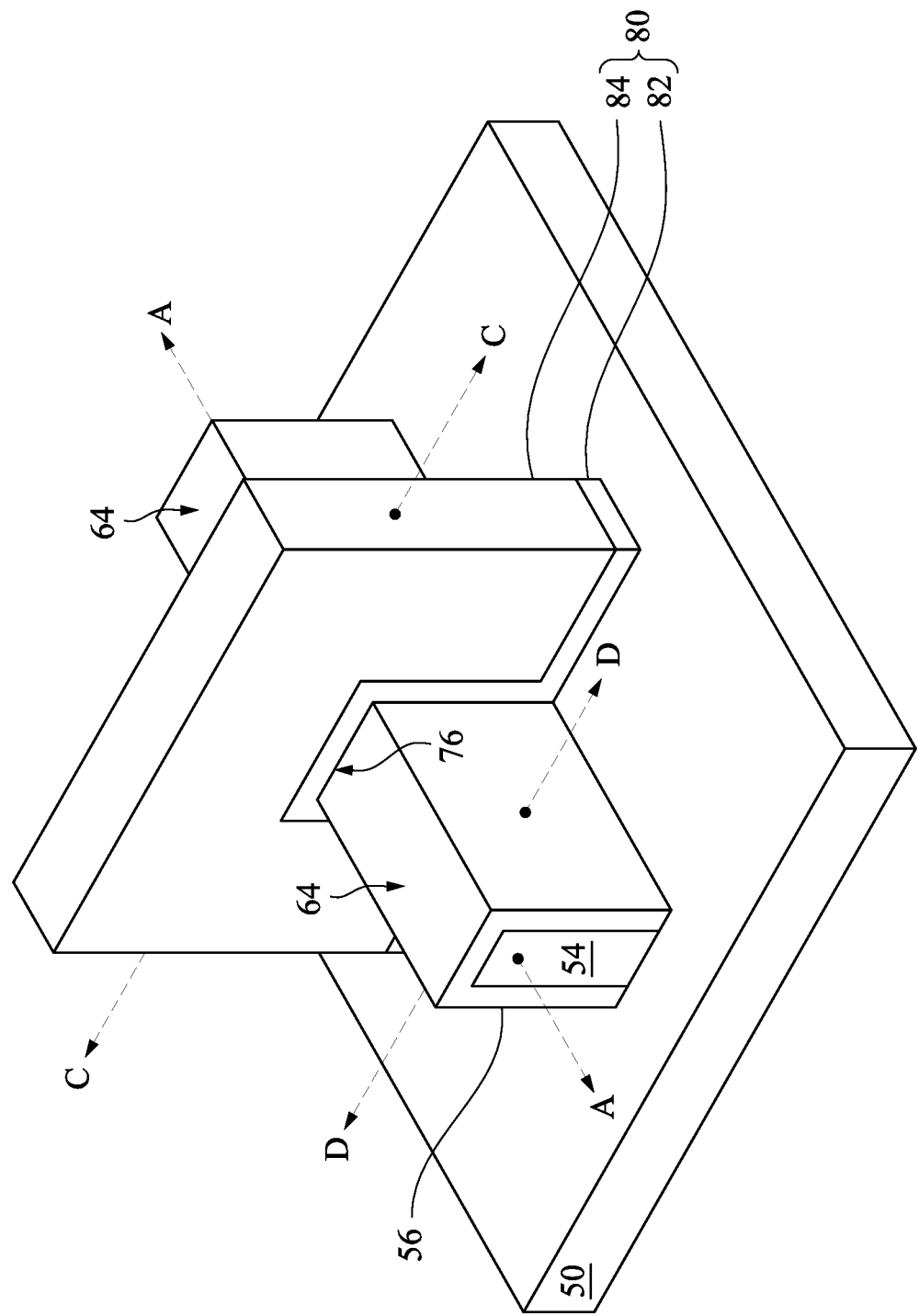
FIG. 1 illustrates an example of a low-dimensional FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a low-dimensional FinFET is formed. The low-dimensional FinFET includes a low-dimensional layer used to form source/drain regions and a channel region. Source/drain contacts that contact sidewalls and top surfaces of the low-dimensional layer can be formed by etching openings for the source/drain contacts through the low-dimensional layer and then forming the source/drain contacts in the openings and on the low-dimensional layer. Further, a gate structure for the low-dimensional FinFET is formed on the channel region. The length of the gate structure may be controlled in a self-aligned manner by forming temporary self-assembled spacers on the source/drain contacts, and then forming the gate structure between the self-assembled spacers. By controlling the thickness of the self-assembled spacers, the length of the resulting gate structure may be controlled.

FIG. 1 illustrates an example of a low-dimensional FinFET in a three-dimensional view, in accordance with some embodiments. The low-dimensional FinFET includes a fin 54 on a substrate 50. The fin 54 protrudes above and from the substrate 50. Although the fin 54 is illustrated as being a different material than the substrate 50, the fin 54 and/or the substrate 50 may comprise a single material or a plurality of materials. In this context, the fin 54 refers to the portion extending above and from the substrate 50. A low-dimensional layer 56 extends along sidewalls and a top surface of the fin 54.

The low-dimensional layer 56 is formed of a low-dimensional material that acts as both a channel material and a source/drain material for conducting currents of the low-dimensional FinFET. For example, the low-dimensional layer 56 may include a carbon nanotube layer, a transition metal dichalcogenide (TMD) layer, a graphene layer, or the like. A first portion of the low-dimensional layer 56 beneath the gate structure 80 act as a channel region 76. Second portions of the low-dimensional layer 56 on the opposing sides of the gate structure 80 act as source/drain regions 64.

A gate structure 80 extends along sidewalls and a top surface of the channel region 76. The gate structure 80 includes a gate dielectric 82 and a gate electrode 84. The gate dielectric 82 is on the low-dimensional layer 56, and the gate electrode 84 on the gate dielectric 82. The source/drain regions 64 are disposed at opposing sides of the gate structure 80, e.g., adjacent the channel region 76. As discussed in further detail below, source/drain contacts will be formed to the source/drain regions 64 in a manner that allows the source/drain contacts to have a low contact resistance and allows the length of the channel region 76 to be determined in a self-aligned manner.

FIG. 1 further illustrates reference cross-sections that are used in later figures. Cross-section A-A is along a longitudinal axis of the fin 54 and in a direction of, for example, a current flow between the source/drain regions 64. Cross-section C-C is perpendicular to cross-section A-A and is along a longitudinal axis of the gate structure 80. Cross-section D-D is perpendicular to cross-section A-A and extents through a source/drain region 64. Subsequent figures refer to these reference cross-sections for clarity.

FIGS. 2A through 5B are various views of intermediate stages in the manufacturing of low-dimensional FinFETs, in accordance with some embodiments. FIGS. 2A, 3A, 4A, and 5A are cross-sectional views illustrated along reference cross-section A-A in FIG. 1. FIGS. 2B, 3B, 4B, and 5B are top-down views, where FIGS. 2A, 3A, 4A, and 5A are also shown along respective reference cross-sections A-A in FIGS. 2B, 3B, 4B, and 5B. FIGS. 2A through 5B illustrate processing of a region of a single fin, but it should be appreciated that multiple fins/FinFETs can be simultaneously processed.

Figure 2B:
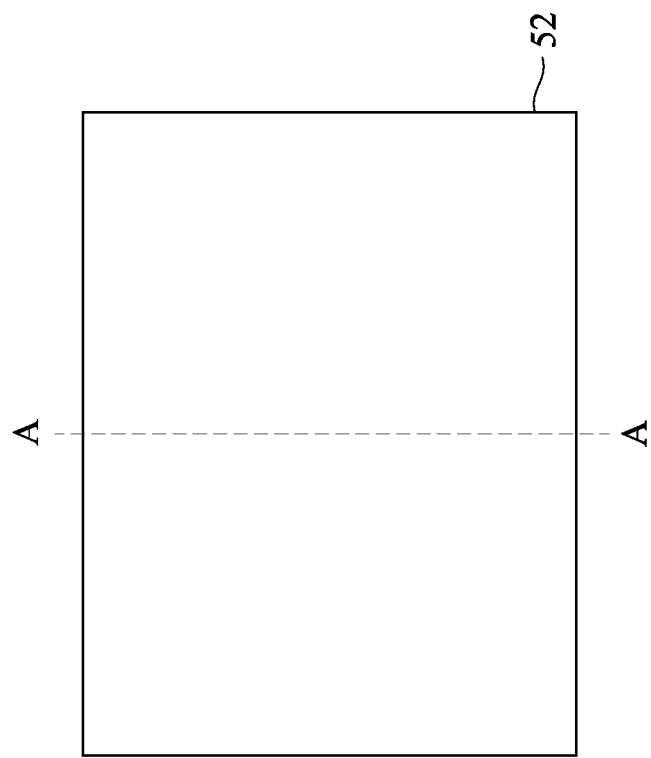
Figure 2A:
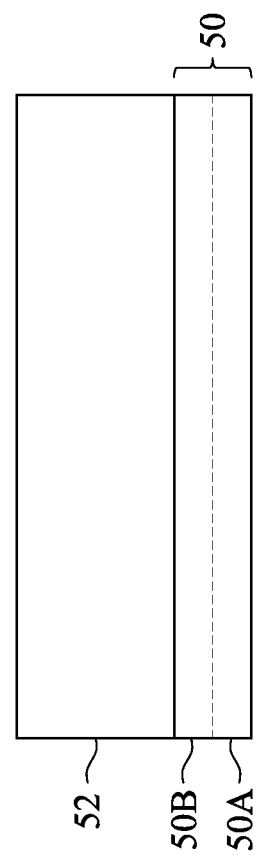

In FIGS. 2A and 2B, a substrate 50 is provided. The substrate 50 can be formed of any material that insulates neighboring low-dimensional FinFETs, and may also be referred to as an "isolation layer." In some embodiments, the substrate 50 includes a semiconductor core 50A, and an isolation material 50B on the semiconductor core 50A.

The semiconductor core 50A may be a bulk semiconductor, a semiconductor-on-insulator (SOI) substrate, or the like, which may be doped (e.g., with a p-type or an n-type dopant) or undoped. The semiconductor core 50A may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the semiconductor core 50A may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. The semiconductor core 50A may also be formed of other materials such as sapphire, indium tin oxide (ITO), or the like.

The isolation material 50B may be any electrically insulating material. The isolation material 50B may be an oxide such as silicon oxide, aluminum oxide, phosphosilicate glass (PSG), borosilicate glass (BSG), boron-doped phosphosilicate glass (BPSG), a tetraethyl orthosilicate (TEOS) based oxide, or the like; a nitride such as silicon nitride or the like; the like; or a combination thereof. The isolation material 50B may be a high-k dielectric material, such as a dielectric material having a k-value greater than about 7.0, such as a metal oxide or a silicate of hafnium, aluminum, zirconium, lanthanum, manganese, barium, titanium, lead, and combinations thereof. The isolation material 50B may be formed by spin coating; a deposition process such as chemical vapor deposition (CVD), plasma enhanced chemical vapor deposition (PECVD), flowable chemical vapor deposition (FCVD), low pressure chemical vapor deposition (LPCVD), or the like; the like; or a combination thereof. In some embodiments, the isolation material 50B is a nitride such as silicon nitride, and is formed by a deposition process such as CVD.

A dielectric layer 52 is formed on the substrate 50, e.g., on the isolation material 50B. The dielectric layer 52 will be subsequently patterned to form fins for the low-dimensional FinFETs. The dielectric layer 52 may be formed of an oxide such as silicon oxide; a nitride such as silicon nitride; a low-dimensional material such as hexagonal Boron Nitride (hBN); the like; or combinations thereof. The dielectric layer 52 may be formed of a low-k dielectric material, such as a dielectric material having a k-value lower than about 3.0, such as PSG, BSG, or the like. The dielectric layer 52 may have a single-layer structure or a composite structure including a plurality of layers. The dielectric layer 52 may include crystalline layer(s) (single crystalline or polycrystalline) and/or amorphous layer(s). The dielectric layer 52 may be formed by PECVD, molecular-beam deposition (MBD), atomic layer deposition (ALD), or the like. The dielectric layer 52 may also be formed through transferring. For example, when the dielectric layer 52 includes hBN, a layer of hBN may be formed on another substrate such as a sapphire substrate, a copper substrate, or the like, and then transferred onto the substrate 50. In some embodiments, the dielectric layer 52 includes a layer of hBN on a layer of low-k dielectric material. Forming the dielectric layer 52 from a low-k dielectric material or a low-dimensional material can help improve electrostatic control by suppressing surface scattering due to its atomically smooth surface Forming the dielectric layer 52 from a low-k dielectric material can also allow the dielectric layer 52 to be patterned into fins of a large width-to-height aspect ratio (discussed in further detail below).

In FIGS. 3A and 3B, a fin 54 is formed in the dielectric layer 52. The fin 54 is a dielectric strip. A single fin 54 is illustrated, but it should be appreciated that multiple fin 54 can be simultaneously formed on a same substrate 50 and can be processed using similar processes as those described herein. In some embodiments, the fin 54 may be formed in the dielectric layer 52 by etching trenches in the dielectric layer 52. The etching may be any acceptable etch process, such as a reactive ion etch (RIE), neutral beam etch (NBE), the like, or a combination thereof. The etch may be anisotropic. The etching selectively etches the material of the dielectric layer 52 at a faster rate than the material of the substrate 50 (e.g., the isolation material 50B) so that the etching stops at the substrate 50.

The fin 54 may be patterned by any suitable method. For example, the fin 54 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin 54. In some embodiments, the mask (or other layer) may remain on the fin 54.

The fin 54 is formed to a width $W_1$ and a height $H_1$. As noted above, the fin 54 can be formed of a low-k dielectric material, which can be easily etched to form the fin 54 to a large width-to-height aspect ratio. For example, the width $W_1$ can be in the range of about 1 nm to about 15 nm, the height $H_1$ can be in the range of about 10 nm to about 300 nm.

Figure 4B:
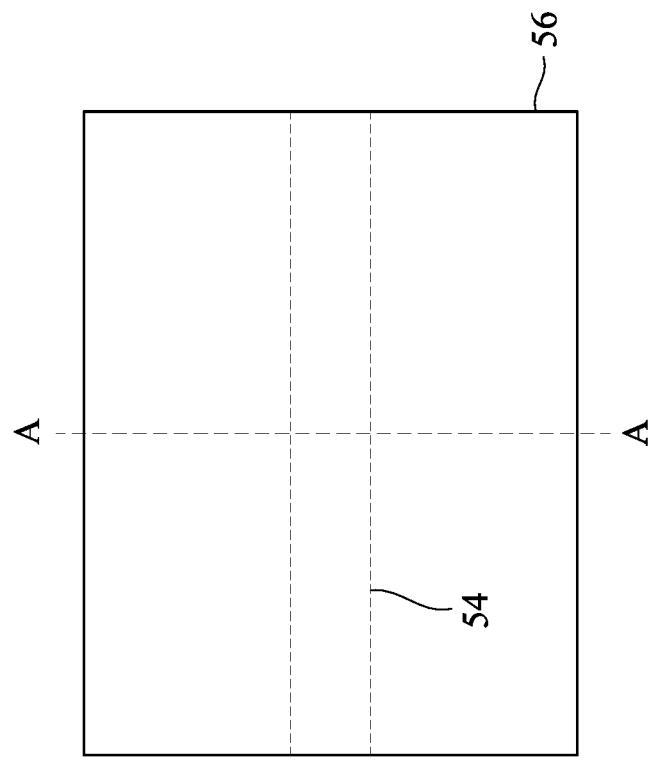
Figure 4A:
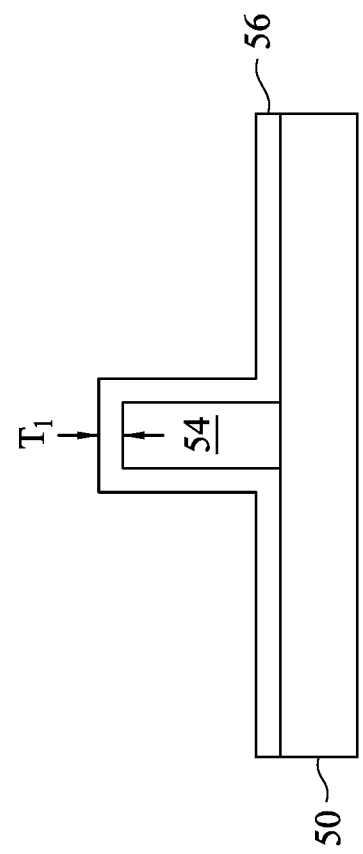

In FIGS. 4A and 4B, a low-dimensional layer 56 is conformally formed on the fin 54 and the substrate 50. Throughout the description, the term "low-dimensional" refers to layer whose thicknesses are small, such as smaller than about 10 nm, smaller than about 5 nm, or smaller than about 1 nm. In some embodiments, the low-dimensional layer 56 has a thickness $T_1$ in the range of about 0.3 nm to about 1 nm. The low-dimensional layer 56 can be as thin as one monolayer.

Low-dimensional materials can sustain high intrinsic mobility at very small thicknesses. Atomically thin channel materials provide an ideal geometry for superior electrostatic control. Further, atomically thin channel materials can have a reasonable band gap size, such as in the range of around 1 eV to about 2 eV, giving them a semiconducting behavior. Low-dimensional materials can also be formed to have metallic or insulating behaviors. Several types of low-dimensional materials may be used to form the low-dimensional layer 56. Example low-dimensional material layers include carbon nanotube networks, aligned carbon nanotubes, layers of semiconductor-like two-dimensional (2D) materials such as transition metal dichalcogenides (TMDs), graphene nanoribbons, or the like. Low-dimensional material layers can be formed as described in U.S. patent application Ser. No. 16/837,261, which is incorporated herein by reference in its entirety. Carbon nanotube networks can be formed of single-wall carbon nanotubes (SWCNTs) grown by an immersion process. In a plan view, a carbon nanotube network may look like a plurality of straight (or slightly curved) tubes (with different lengths) placed randomly. Aligned carbon nanotubes can be grown using a carbon-containing precursor at a high temperature so that the precursor decomposes and carbon is grown. In a plan view, aligned carbon nanotubes have lengthwise directions generally aligned in the same direction, and can have similar lengths. A TMD layer includes the compound of a transition metal and a group-VIA element formed by a deposition process such as PECVD. The transition metal may be W, Mo, Ti, V, Co, Ni, Zr, Tc, Rh, Pd, Hf, Ta, Re, Ir, Pt, or the like. The group-VIA element may be sulfur (S), selenium (Se), tellurium (Te), or the like. Example TMD layers include $MoS_2$, $MoSe_2$, $WS_2$, $WSe_2$, or the like. Graphene nanoribbons are strips of graphene that can be formed by graphite nanotomy, epitaxy, a deposition process such as CVD, or the like. It should be appreciated that other acceptable low-dimensional materials may be used. In embodiments where a low-dimensional material layer includes discrete elements, such as carbon nanotubes or graphene nanoribbons, the low-dimensional material layer can further include a dielectric material to fill the space between the discrete elements. Thus, the low-dimensional layer 56 can be a carbon nanotube layer (e.g., carbon nanotube networks, aligned carbon nanotubes, or the like in a dielectric material), a transition metal dichalcogenide (TMD) layer (e.g., one or more layers of a TMD), a graphene layer (e.g., graphene nanoribbons in a dielectric material), or the like.

Figure 5B:
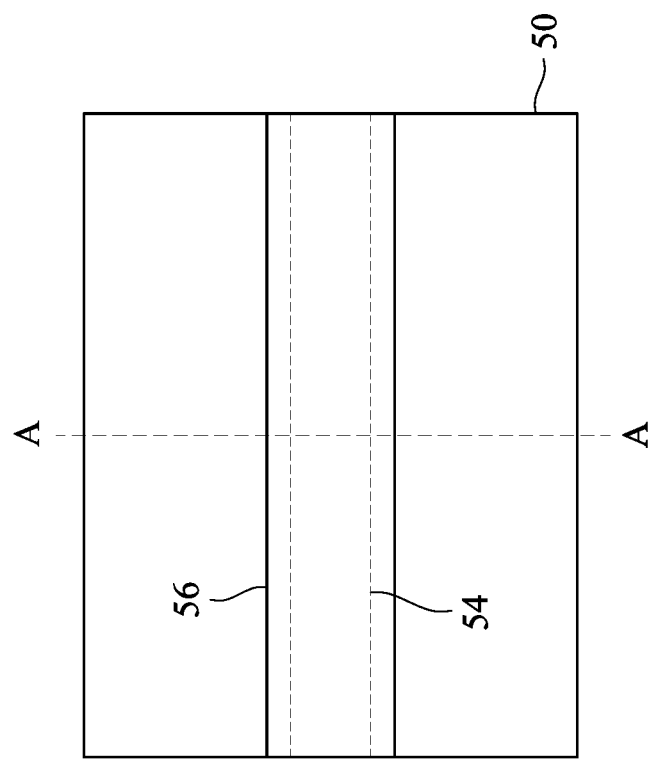
Figure 5A:
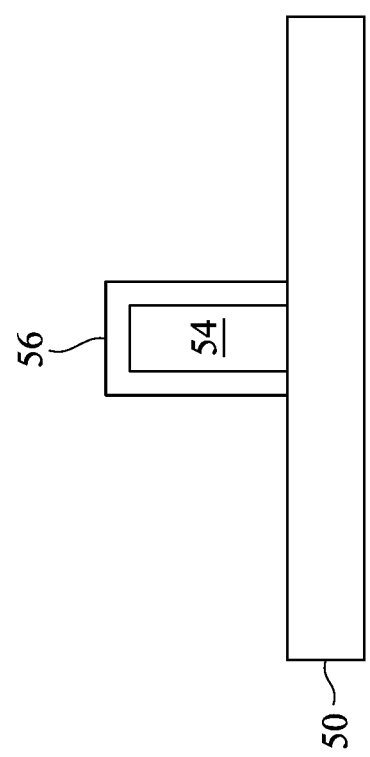

In FIGS. 5A and 5B, the low-dimensional layer 56 is patterned to remove portions of the low-dimensional layer 56 extending along a major surface of the substrate 50, thus exposing the substrate 50. Remaining portions of the low-dimensional layer 56 cover the fin 54. The low-dimensional layer 56 may be patterned using acceptable photolithography and etching techniques. The remaining portions of the low-dimensional layer 56 will form channel regions and source/drain regions of the resulting low-dimensional FinFETs.

FIGS. 6A through 18D are various views of further intermediate stages in the manufacturing of low-dimensional FinFETs, in accordance with some embodiments. FIGS. 6A, 7A, 8A, 9A, 10A, 11A, 12A, 13A, 14A, 15A, 16A, 17A, and 18A are cross-sectional views illustrated along reference cross-section A-A in FIG. 1. FIGS. 6B, 7B, 8B, 9B, 10B, 11B, 12B, 13B, 14B, 15B, 16B, 17B, and 18B are top-down views, where FIGS. 6A, 7A, 8A, 9A, 10A, 11A, 12A, 13A, 14A, 15A, 16A, 17A, and 18A are also shown along respective reference cross-sections A-A in FIGS. 6B, 7B, 8B, 9B, 10B, 11B, 12B, 13B, 14B, 15B, 16B, 17B, and 18B. FIG. 18C is a cross-sectional view illustrated along reference cross-section C-C in FIG. 1. FIG. 18D is a cross-sectional view illustrated along reference cross-section D-D in FIG. 1. FIGS. 6A through 18D illustrate processing of a region of a single fin, but it should be appreciated that multiple fins/FinFETs can be simultaneously processed.

As discussed in further detail below, FIGS. 6A through 10B illustrate an embodiment process in which source/drain contacts to source/drain regions are formed through a regrowth process. Specifically, portions of the low-dimensional layer 56 (and optionally the fin 54) are removed to form openings 60 (see FIGS. 7A and 7B). A conductive material is regrown in the openings 60 to form source/drain contacts 62 (see FIGS. 10A and 10B), which are connected to source/drain regions 64 of the low-dimensional layer 56. For example, when the low-dimensional layer 56 includes aligned carbon nanotubes, the portions of the low-dimensional layer 56 including the ends of the nanotubes act as source/drain regions 64, and the source/drain contacts 62 can be connected to (such as in contact with) the ends of the nanotubes. However, such a process may also be used when the low-dimensional layer 56 is another type of low-dimensional layer, such as a transition metal dichalcogenide (TMD) layer, a graphene layer, or the like.

Figure 6B:
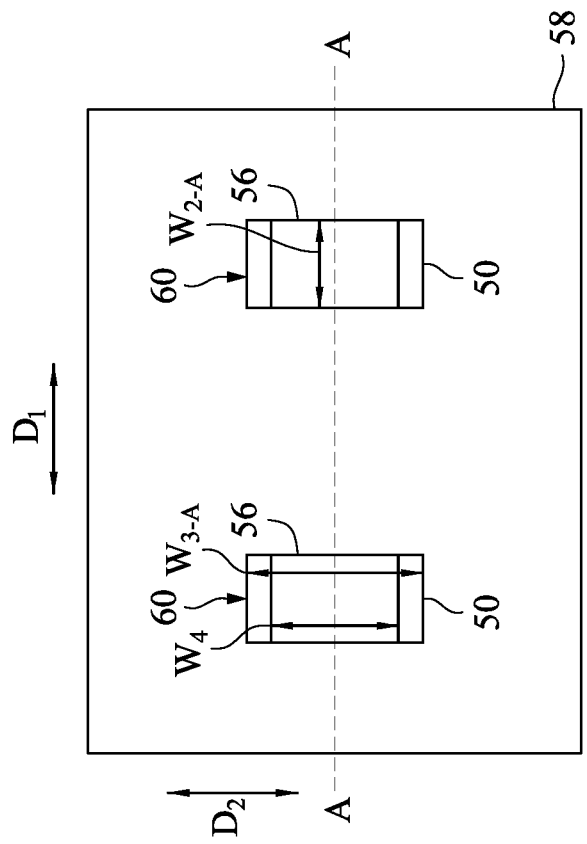
Figure 6A:
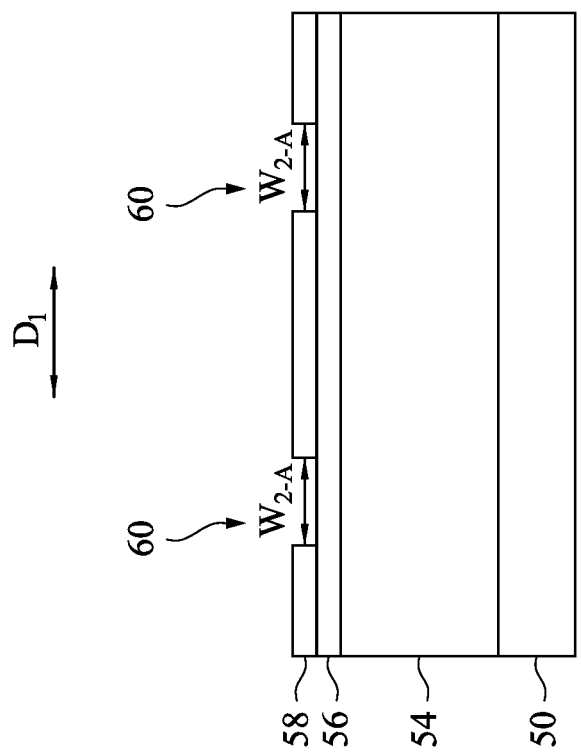

In FIGS. 6A and 6B, a mask 58 is formed over the low-dimensional layer 56 and the substrate 50. The mask 58 has a pattern of openings 60 exposing the underlying low-dimensional layer 56. The openings 60 expose portions of the low-dimensional layer 56 that will act as source/drain regions for the resulting low-dimensional FinFETs, and define where source/drain contacts will be formed. The mask 58 can be formed of a photoresist, such as a single layer photoresist, a bi-layer photoresist, a tri-layer photoresist, or the like. In some embodiments, the mask 58 is a tri-layer mask comprising a bottom layer (e.g., a bottom anti-reflective coating (BARC) layer), a middle layer (e.g., a nitride, an oxide, an oxynitride, or the like), and a top layer (e.g., a photoresist). The type of mask used (e.g., single layer mask, bilayer mask, tri-layer mask, etc.) may depend on the photolithography process used to subsequently pattern the mask 58. For example, in extreme ultraviolet (EUV) lithography processes, the mask 58 may be a single layer mask or a bilayer mask. The mask 58 may be formed by spin coating, a deposition process such as CVD, combinations thereof, or the like.

The mask 58 can be patterned using acceptable photolithography techniques to form the openings 60. The openings 60 are bounded openings that are laterally bordered on all sides by the material(s) of the mask 58. In embodiments where the mask 58 is a photoresist, the photoresist can be patterned by exposing the photoresist to a patterned energy source (e.g., a patterned light source) so as to induce a chemical reaction, thus inducing a physical change in those portions of the photoresist exposed to the patterned light source. The photoresist can then be developed by applying a developer to the exposed photoresist to take advantage of the physical changes and selectively remove either the exposed portion of the photoresist or the unexposed portion of the photoresist, depending upon the desired pattern.

Example photoresist developers include methyl isobutyl ketone (MIBK), diluted isopropyl alcohol, and the like.

The openings 60 are formed to a width $W_{2-A}$, which is measured along a first direction $D_1$, and a width $W_{3-A}$, which is measured along a second direction $D_2$. The first direction $D_1$ is parallel to the longitudinal axis of the fin 54. The second direction $D_2$ is perpendicular to the first direction $D_1$ and is parallel to the latitudinal axis of the fin 54. The width $W_{3-A}$ may (or may not) be greater than the width $W_{2-A}$, and may (or may not) also be greater than the width $W_4$ of the low-dimensional layer 56. For example, the width $W_{2-A}$ can be in the range of about 1 nm to about 50 nm, the width $W_{3-A}$ can be up to about 20 nm, and the width $W_4$ can be up to about 20 nm.

Figure 7B:
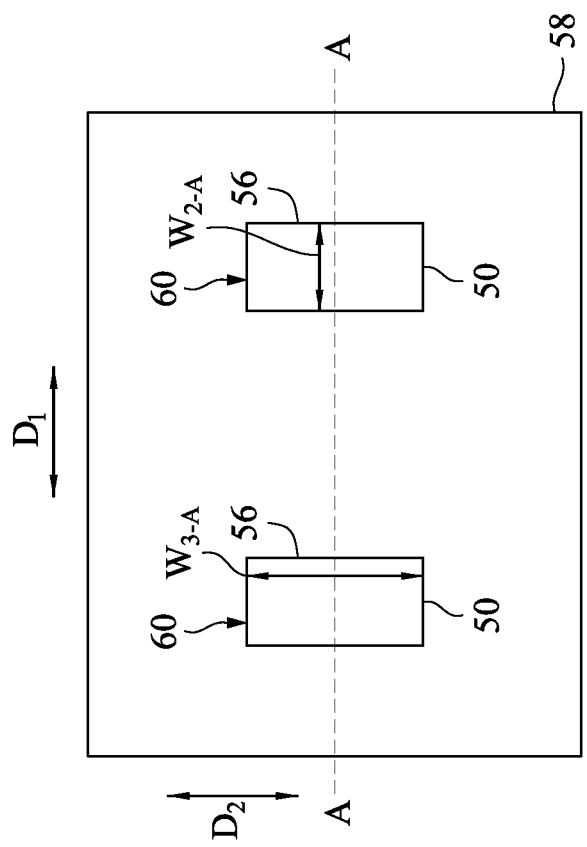
Figure 7A:
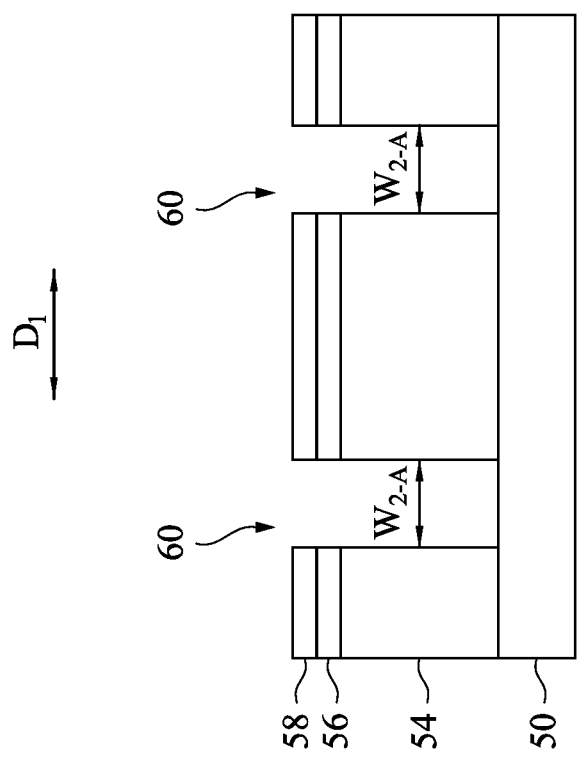

In FIGS. 7A and 7B, the low-dimensional layer 56 is etched using the mask 58 as an etching mask to extend the openings 60 through the low-dimensional layer 56, thus exposing the fin 54. The etching may be any acceptable etch process, such as a reactive ion etch (RIE), neutral beam etch (NBE), the like, or a combination thereof. The etch may be anisotropic. For example the etching can be a dry etch performed with argon, boron trichloride, sulfur hexafluoride, oxygen, or the like. In the illustrated embodiment, the fin 54 is also etched using the mask 58 as an etching mask to extend the openings 60 through the fin 54, thus exposing the substrate 50. The fin 54 may be etched by continuing the process for etching the low-dimensional layer 56, or by performing another etching with different etchants. The etch may be anisotropic. For example the etching can be a dry etch performed with argon. In another embodiment (discussed further below), the opening 60 are not extended through the fin 54.

Figure 8B:
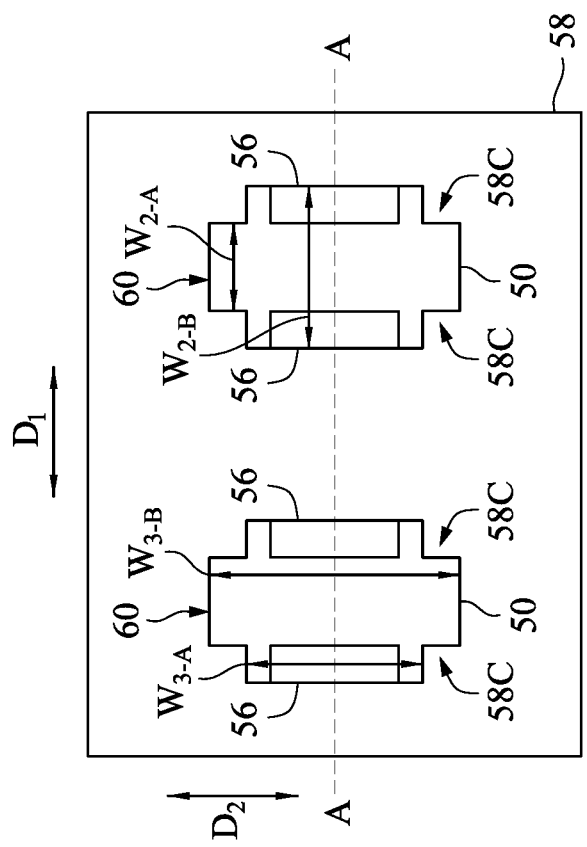
Figure 8A:
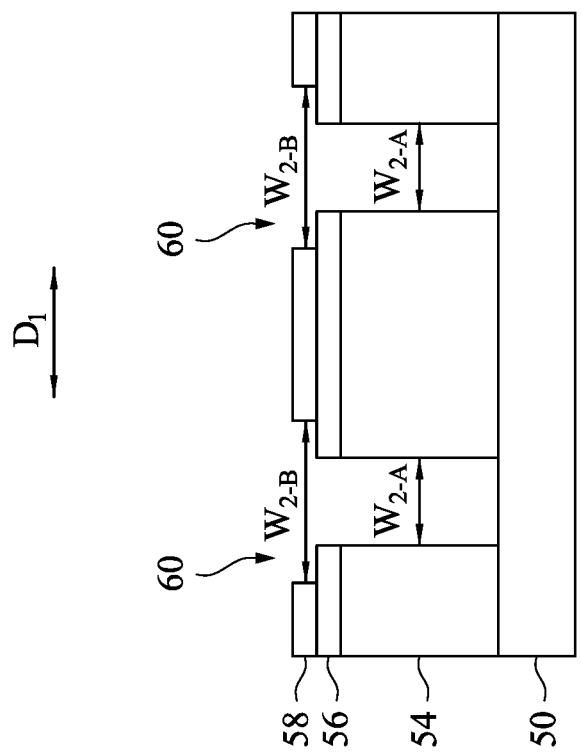

In FIGS. 8A and 8B, the openings 60 in the mask 58 are widened to expose additional portions of the low-dimensional layer 56. Widening the openings 60 exposes additional portions of the low-dimensional layer 56 that will act as source/drain regions for the resulting low-dimensional FinFETs. In embodiments where the mask 58 is a photoresist, the openings 60 in the mask 58 can be widened by repeating the process for developing the photoresist. For example, the developer can be reapplied to the remaining portions of the photoresist. Although the remaining portions of the photoresist are those portions of the photoresist not exposed to a patterned light source, the developer can still remove the unchanged portions of the photoresist, albeit at a slower rate than the portions of the photoresist that were physically changed by exposure. As such, the removal rate when widening the openings 60 in the mask 58 is slower than the removal rate when initially patterning the openings 60 in the mask 58. Likewise, the mask 58 may be exposed to the developer for a longer duration when widening the openings 60 than when initially patterning the openings 60.

The openings 60 in the mask 58 are widened to an increased width $W_{2-B}$, which is measured along the first direction $D_1$ (discussed above), and an increased width $W_{3-B}$, which is measured along the second direction $D_2$ (discussed above). However, the openings 60 in the low-dimensional layer 56 and the fin 54 are not widened. As such, the increased widths $W_{2-B}$, $W_{3-B}$ of the openings 60 in the mask 58 are greater than the original widths $W_{2-A}$, $W_{3-A}$, respectively, of the openings 60 in the mask 58. After the openings 60 are widened, the width $W_{3-B}$ is greater than the width $W_{2-B}$. For example, the width $W_{2-B}$ can be in the range of about 1 nm to about 50 nm, and the width $W_{3-B}$ can be up to about 20 nm.

In some embodiments, the openings 60 are widened along the first direction $D_1$ and the second direction $D_2$ so that corner regions 58C remain in the mask 58 at the corners of the openings 60, in the plan view. The corner regions 58C are disposed over the substrate 50, and do not overlap the low-dimensional layer 56 or the fin 54. The distance between adjacent corner regions 58C along the first direction $D_1$ is the original width $W_{2-A}$. The distance between adjacent corner regions 58C along the second direction $D_2$ is the original width $W_{3-A}$.

The widened openings 60 in the mask 58 expose top surfaces of the low-dimensional layer 56 which the source/drain contacts will contact. The widths of the openings 60 in the mask 58 determines the widths of the source/drain contacts, and the widths of the source/drain contacts determines the channel lengths $L_{ch}$ (see FIG. 13A, discussed in further detail below) of the resulting low-dimensional FinFETs. In accordance with some embodiments, the openings 60 in the mask 58 are widened according to the desired channel lengths $L_{ch}$. For example, when shorter channel lengths $L_{ch}$ are desired, wider openings 60 are formed in the mask 58. When reapplying the developer to widen the openings 60, the duration of time for reapplication can be selected according to the desired channel lengths $L_{ch}$, with a longer duration resulting in shorter channel lengths $L_{ch}$. Details regarding the control of the channel lengths $L_{ch}$ are discussed in further detail below.

Figure 9B:
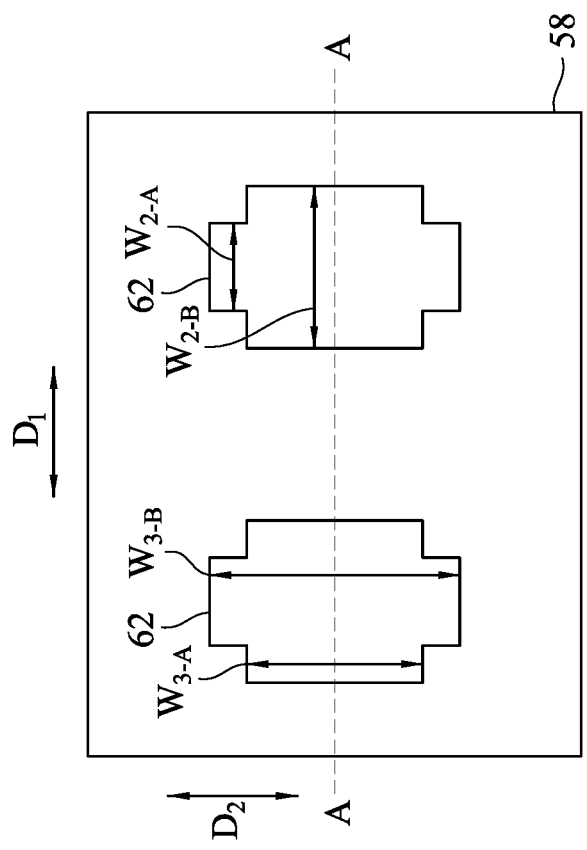
Figure 9A:
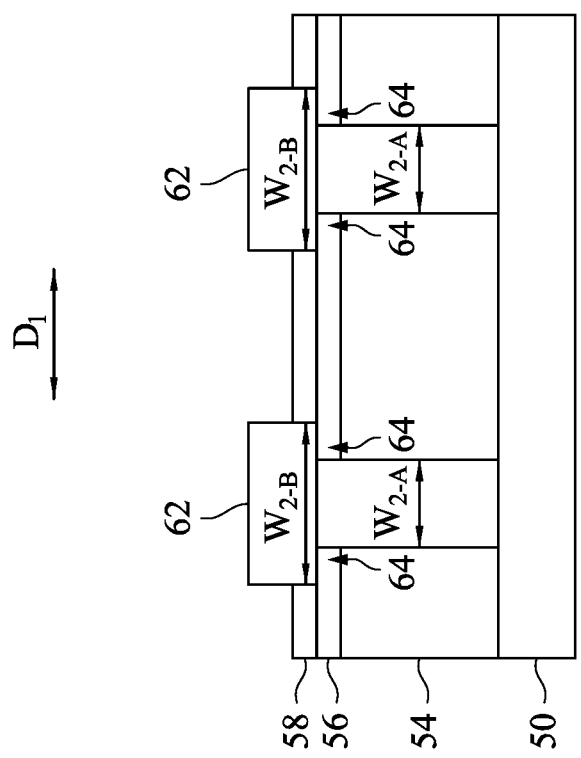

In FIGS. 9A and 9B, source/drain contacts 62 are formed in the openings 60. The source/drain contacts 62 extend through the low-dimensional layer 56. In embodiments where the openings 60 extend through the fin 54, the source/drain contacts 62 also extend through the fin 54 and contact the substrate 50. The source/drain contacts 62 are formed by depositing (e.g., in a top-down manner) or growing (e.g., in a bottom-up manner) a conductive material in the openings 60. The conductive material can be a metal or a low-dimensional material that is formed to have a metallic behavior. Example conductive materials for the source/drain contacts 62 include scandium, titanium, niobium, chromium, tungsten, nickel, palladium, platinum, silver, gold, aluminum, combinations thereof, or the like. In some embodiments, the source/drain contacts 62 are low-dimensional materials, which can be grown from the substrate 50 or the fin 54 by an immersion process, or can be formed on another substrate and then transferred to the substrate 50 or the fin 54. In the illustrated embodiment, the source/drain contacts 62 are grown from the substrate 50. In embodiments where the source/drain contacts 62 do not extend through the fin 54, the source/drain contacts 62 are grown from the fin 54.

The source/drain contacts 62 are physically and electrically coupled to portions of the low-dimensional layer 56 that act as source/drain regions 64. The source/drain contacts 62 are thus in physical contact with the sidewalls and the top surfaces of the source/drain regions 64. When the source/drain regions 64 are part of a carbon nanotube layer, forming the source/drain contacts 62 in contact with the sidewalls of the source/drain regions 64 allows the source/drain contacts 62 to be directly connected to the ends of the carbon nanotubes. Forming the source/drain contacts 62 in contact with the sidewalls of the source/drain regions 64 can increase the contact area. The contact resistance to the source/drain regions 64 may thus be decreased.

Figures 10A, 10B:
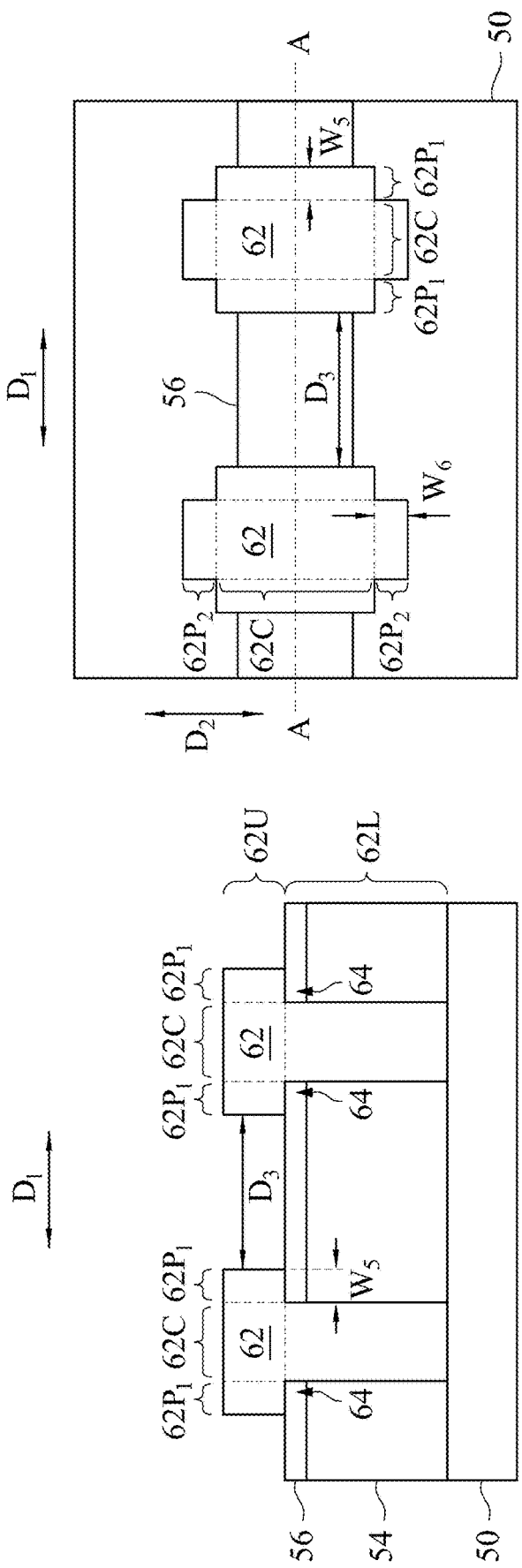

In FIGS. 10A and 10B, the mask 58 is removed. When the mask 58 includes a photoresist, the photoresist can be removed by, e.g., an acceptable ashing process. When the mask 58 includes other layers (e.g., a BARC layer, a nitride layer, etc), accepting etching processes can be used to remove the layers.

As shown by FIG. 10A, in the cross-sectional view, the source/drain contacts 62 have lower portions 62L and upper portions 62U. The lower portions 62L of the source/drain contacts 62 extend through the fin 54 and/or the low-dimensional layer 56. The upper portions 62U of the source/drain contacts 62 extend through the mask 58, and contact the top surfaces of the low-dimensional layer 56. In other words, the upper portions 62U overly the low-dimensional layer 56. The lower portions 62L of the source/drain contacts 62 have the width $W_{2-A}$ along the first direction $D_1$ (see FIG. 9A), and the upper portions 62U of the source/drain contacts 62 have the width $W_{2-B}$ along the first direction $D_1$ (see FIG. 9A).

As shown by FIG. 10B, in the plan view, each source/drain contact 62 has a center portion 62C, a pair of first projecting portions $62P_1$, and a pair of second projecting portions $62P_2$. The center portion 62C is disposed between the first projecting portions $62P_1$ so that the first projecting portions $62P_1$ extend away from the center portion 62C along the first direction $D_1$. The center portion 62C is also disposed between the second projecting portions $62P_2$ so that the second projecting portions $62P_2$ extend away from the center portion 62C along the second direction $D_2$. The center portion 62C has the width $W_{2-A}$ along the first direction $D_1$ and has the width $W_{3-A}$ along the second direction $D_2$ (see FIG. 9B).

The first projecting portions $62P_1$ are directly over and contact the top surfaces of the low-dimensional layer 56, such as the top surfaces of the source/drain regions 64. The first projecting portions $62P_1$ can also contact the top surface of the substrate 50. The first projecting portions $62P_1$ have a width $W_5$ measured along the first direction $D_1$, which equals half the difference between the width $W_{2-B}$ and the width $W_{2-A}$ (see FIG. 9A). The combined width of the center portion 62C and the first projecting portions $62P_1$ is equal to the width $W_{2-B}$ (see FIG. 9B).

The second projecting portions $62P_2$ are directly over and contact the top surface of the substrate 50. The second projecting portions $62P_2$ do not contact the top surfaces of the low-dimensional layer 56. The second projecting portions $62P_2$ have a width $W_6$ measured along the second direction $D_2$, which equals half the difference between the width $W_{3-B}$ and the width $W_{3-A}$ (see FIG. 9B). The combined width of the center portion 62C and the second projecting portions $62P_2$ is equal to the width $W_{3-B}$ (see FIG. 9B).

After formation, the source/drain contacts 62 are spaced apart by a distance $D_3$ along the first direction $D_1$. The distance $D_3$ can be in the range of about 1 nm to about 50 nm. The distance $D_3$ between the source/drain contacts 62 can be controlled by controlling the widths $W_{2-B}$ of the openings 60 (see FIG. 8A), which affects the widths $W_5$ of the first projecting portions $62P_1$ of the source/drain contacts 62. Specifically, forming the source/drain contacts 62 to have first projecting portions $62P_1$ with large widths $W_5$ allows the distance $D_3$ between the source/drain contacts 62 to be decreased. As discussed further below, the distance $D_3$ between the source/drain contacts 62 corresponds to the channel lengths $L_a$, (see FIG. 13A, discussed in further detail below) of the resulting low-dimensional FinFETs. Controlling the distance $D_3$ between the source/drain contacts 62 allows the channel lengths $L_a$, to be determined in a self-aligned manner.

Figure 11C:
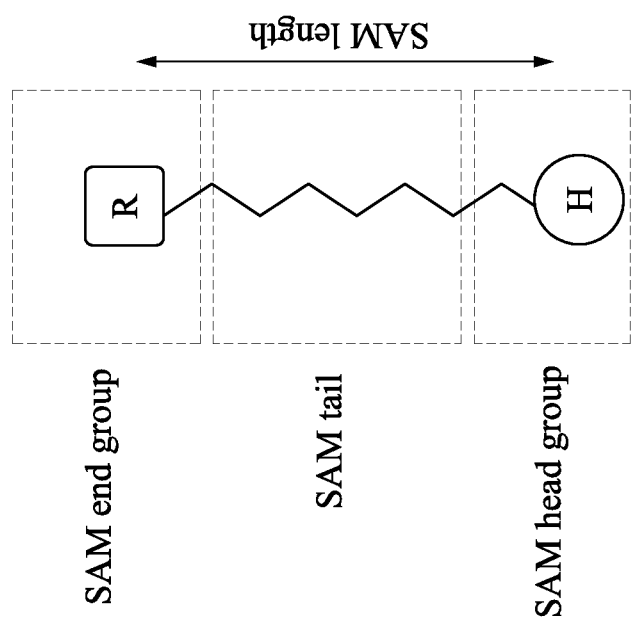
FIG. 11C illustrates a molecule from a self-assembled monolayer (SAM).

In FIGS. 11A and 11B, spacers 70 are formed on the source/drain contacts 62. The spacers 70 are formed of a self-assembled monolayer (SAM) of molecules, and may also be referred to as self-assembled spacers. As shown by FIG. 11C, each molecule of a SAM includes a head group, a tail, and an end group. The head group may be a thiol, a phosphonate, a silane, or the like, anchored to a surface of the spacers 70. The end group can be any functional group. The tail includes one or more methylene bridges that connect the head group to the end group. The length of the SAM is determined by the chain lengths of the tails and the attraction between the head groups and the end groups.

The molecules of the SAM are oriented so that they extend in a perpendicular direction away from the surfaces of the source/drain contacts 62. Thus, the length of the SAM determines the thickness of the spacers 70. After formation, the vertical portions of the spacers 70 have a thickness $T_2$ and the horizontal portions of the spacers 70 have a thickness $T_3$. According to some embodiments, the end group is selected so that the SAM has a desired length, and thus the spacers 70 have desired thicknesses $T_2$, $T_3$. The spacers 70 can be grown by adsorbing (e.g., by chemisorption) each of the head groups on the surfaces of the source/drain contacts 62. The tail may then be organized and assembled into an ordered two-dimensional or three-dimensional structure. The terminal end of the tail can then be functionalized with the selected end group. The end group can be octadecyltrichlorosilane, $SiMeCl_3$, $SiMe_2Cl_2$, $SiMe_3Cl$, $SiMe_3Br$, $SiMe_3I$, hexamethyldisilazane, n-$BuSiCl_3$, iso-$BuSiCl_3$, tert-$BuSiCl_3$, benzyl-$SiCl_3$, perflurooctyltrichlorosilane, or the like.

The spacers 70 are separated by a distance $D_4$. The distance $D_4$ can be in the range of about 1 nm to about 20 nm. The distance $D_4$ between the spacers 70 can be controlled by controlling the thickness $T_2$ of the spacers 70. Specifically, forming the spacers 70 to have large thickness $T_2$ allows the distance $D_4$ between the spacers 70 to be decreased. As discussed further below, the distance $D_4$ between the spacers 70 corresponds to the gate lengths $L_g$ (see FIG. 13A, discussed in further detail below) of the resulting low-dimensional FinFETs. Controlling the distance $D_4$ between the spacers 70 allows the gate lengths $L_g$ to be determined in a self-aligned manner. When growing the spacers 70, the end group of the SAM can be selected according to the desired gate lengths $L_g$, with a longer SAM forming thicker spacers 70 and resulting in shorter gate lengths $L_g$.

The SAM of the spacers 70 may not form in a completely uniform manner. Specifically, growth of the SAM may be impeded in crowded regions, such as at the interfaces of the source/drain contacts 62 and the source/drain regions 64, and at the corners of the source/drain contacts 62. As such, the thicknesses $T_2$, $T_3$ may be non-uniform. Specifically, the thicknesses $T_2$ of the vertical portions of the spacers 70 may increase in a direction extending away from the low-dimensional layer 56, but only to a point, and then begin decreasing along the same direction. Likewise, the thicknesses $T_3$ of the horizontal portions of the spacers 70 may be greater at the centers of the top surfaces of the source/drain contacts 62, and decrease at edges of the top surfaces of the source/drain contacts 62. The spacers 70 may thus have rounded surfaces, such as convex top surfaces.

In FIGS. 12A and 12B, a gate dielectric layer 72 is formed. The gate dielectric layer 72 includes one or more layers deposited on the top surfaces and the sidewalls of the low-dimensional layer 56 and the spacers 70. The gate dielectric layer 72 may also be formed on the top surface of the substrate 50. In some embodiments, the gate dielectric layer 72 comprises one or more dielectric layers, such as one or more layers of silicon oxide, silicon nitride, metal oxide, metal silicate, or the like. For example, in some embodiments, the gate dielectric layer 72 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layer 72 may include a dielectric layer having a k value greater than about 7.0. The formation methods of the gate dielectric layer 72 may include Molecular-Beam Deposition (MBD), ALD, PECVD, and the like. The gate dielectric layer 72 can also be formed of a low-dimensional insulating material with a large bandgap, such as hexagonal Boron Nitride (hBN), which can be grown in a bottom-up manner. The gate dielectric layer 72 can be formed to a small thickness, such as in the range of about 0.5 nm to about 15 nm. In some embodiments, the gate dielectric layer 72 is thicker than the low-dimensional layer 56.

A gate electrode layer 74 is then formed on the gate dielectric layer 72. The gate electrode layer 74 can be deposited on the gate dielectric layer 72. The gate electrode layer 74 may include a metal-containing material such as titanium nitride, titanium oxide, tantalum nitride, tantalum carbide, cobalt, ruthenium, aluminum, tungsten, combinations thereof, or multi-layers thereof. For example, although a single gate electrode layer 74 is illustrated, the gate electrode layer 74 may comprise any number of liner layers, any number of work function tuning layers, and a fill material.

The gate dielectric layer 72 and the gate electrode layer 74 are then patterned to remove portions of the gate dielectric layer 72 and the gate electrode layer 74 extending along a major surface of the substrate 50, thus exposing the substrate 50. Remaining portions of the gate dielectric layer 72 and the gate electrode layer 74 cover the low-dimensional layer 56 and the spacers 70. The gate dielectric layer 72 and the gate electrode layer 74 may be patterned using acceptable photolithography and etching techniques.

Figure 13A:
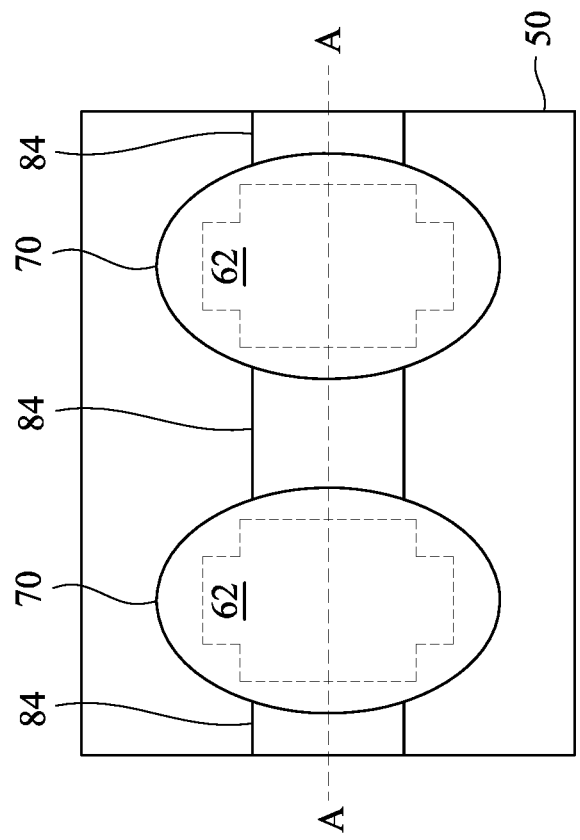
Figure 13B:
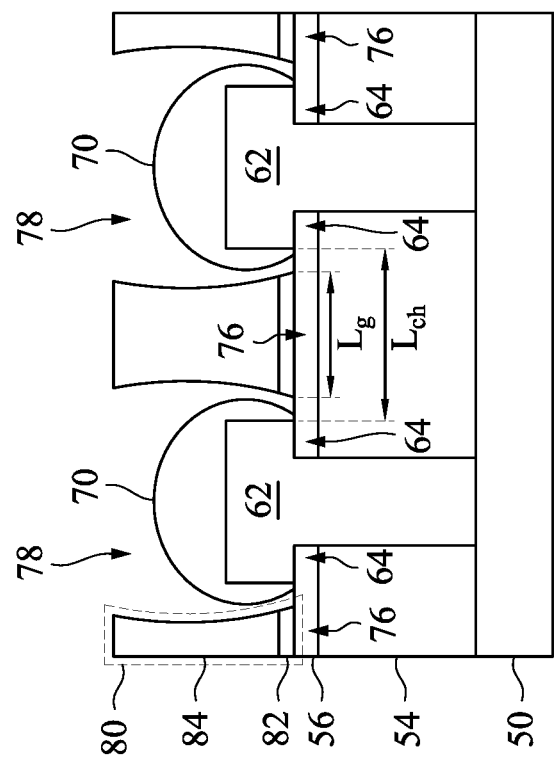

In FIGS. 13A and 13B, the gate dielectric layer 72 and the gate electrode layer 74 are patterned to form gate dielectrics 82 and gate electrodes 84, respectively. The patterning removes portions of the gate dielectric layer 72 and the gate electrode layer 74 over the spacers 70, thereby forming openings 78 exposing the spacers 70 and some portions of the low-dimensional layer 56. The gate dielectrics 82 and the gate electrodes 84 form gate structures 80 of the resulting low-dimensional FinFETs. The gate structures 80 may also be referred to as "gate stacks."

The gate dielectric layer 72 and the gate electrode layer 74 may be patterned by any acceptable process. In some embodiments, the gate dielectric layer 72 and the gate electrode layer 74 are patterned using acceptable photolithography and etching techniques. In some embodiments, the gate dielectric layer 72 and the gate electrode layer 74 are patterned using an adhesion lithography process. In an adhesion lithography process, an adhesive tape (not shown) is adhered to the gate electrode layer 74, such as to a top surface of the gate electrode layer 74. The tape is then peeled off the gate electrode layer 74 by pulling the tape in a direction perpendicular to the major surface of the substrate 50. The peeling edge of the tape thus travels laterally across the substrate 50. When peeling off the tape, thinner portions of the gate dielectric layer 72 and the gate electrode layer 74 (e.g., those portions on the spacers 70) break away and stick to the tape, but thicker portions of the gate dielectric layer 72 and the gate electrode layer 74 (e.g., those portions on the low-dimensional layer 56) do not break away and remain.

The gate structures 80 cover portions of the low-dimensional layer 56 that act as channel regions 76. Specifically, the gate structures 80 extend along sidewalls and top surfaces of the low-dimensional layer 56, e.g., of the channel regions 76. The channel regions 76 of the low-dimensional layer 56 are those portions of the low-dimensional layer 56 that extend between the source/drain regions 64 and underlie the gate structures 80. The channel lengths $L_{ch}$ of the channel regions 76 are determined by the distance $D_3$ (sees FIGS. 10A and 10B) between the source/drain contacts 62. The distance $D_3$ (see FIGS. 10A and 10B) between the source/drain contacts 62 may be selected based on the desired channel lengths $L_{ch}$, with a smaller distance $D_3$ resulting in smaller channel lengths $L_{ch}$. The channel lengths $L_{ch}$ can be in the range of about 1 nm to about 20 nm.

The gate structures 80 have gate lengths $L_g$ that are determined by the distance $D_4$ (sees FIGS. 11A and 11B) between the spacers 70. The gate lengths $L_g$ may be controlled at two steps of processing. First, the distance $D_3$ (see FIGS. 10A and 10B) between the source/drain contacts 62 may be selected based on the desired gate lengths $L_g$, with a smaller distance $D_3$ resulting in smaller gate lengths $L_g$. Second, the thickness $T_2$ of the spacers 70 may be selected based on the desired gate lengths $L_g$, with a larger thickness $T_2$ of the spacers 70 resulting in smaller gate lengths $L_g$. The gate lengths $L_g$ can be in the range of about 1 nm to about 20 nm.

Because the spacers 70 have convex surfaces, the gate structures 80 (e.g., the gate electrodes 84) have concave sidewalls. Specifically, the gate lengths $L_g$ of the gate structures 80 decrease in a direction extending away from the low-dimensional layer 56, but only to a point, and then begin increase along the same direction. Such a shape may also be referred to as a "footer" or an "hourglass" shape. With such a shape, each gate structure 80 has an upper width at a top of the gate structure 80, a central width at a middle of the gate structure 80, and a lower width at a bottom of the gate structure 80, with the central width being less than each of the upper width and the lower width. In some embodiments, the distance between a gate electrode 84 and a source/drain region 64 is less than the distance between a corresponding gate dielectric 82 and the source/drain region 64.

Figure 14B:
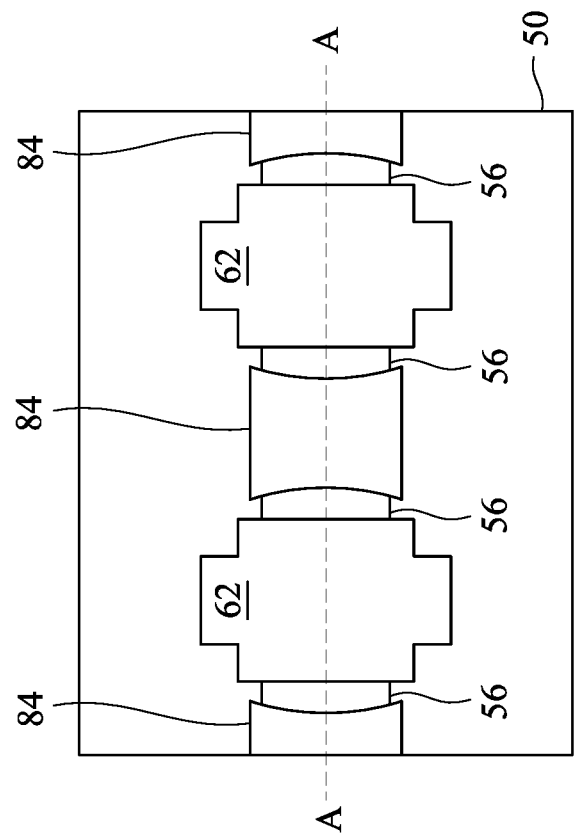
Figure 14A:
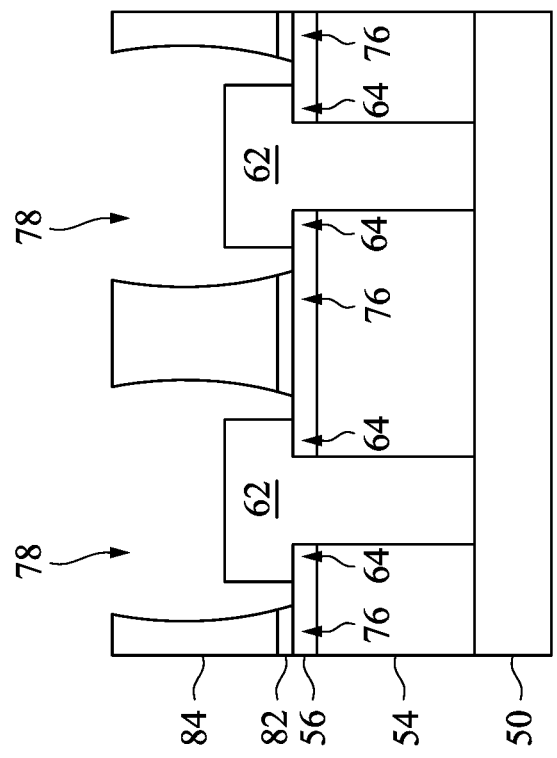

In FIGS. 14A and 14B, the spacers 70 are removed to expose the source/drain contacts 62 in the openings 78. The spacers 70 may be removed by an acceptable etching process, such as one that selectively etches the material of the spacers 70 at a faster rate than the materials of the low-dimensional layer 56, the source/drain contacts 62, the gate dielectrics 82, and the gate electrodes 84. The etching may be isotropic. For example, the etching may include a wet etch. The etchant can be selected based on the molecules of the SAM used to form the spacers 70.

Figure 15A:
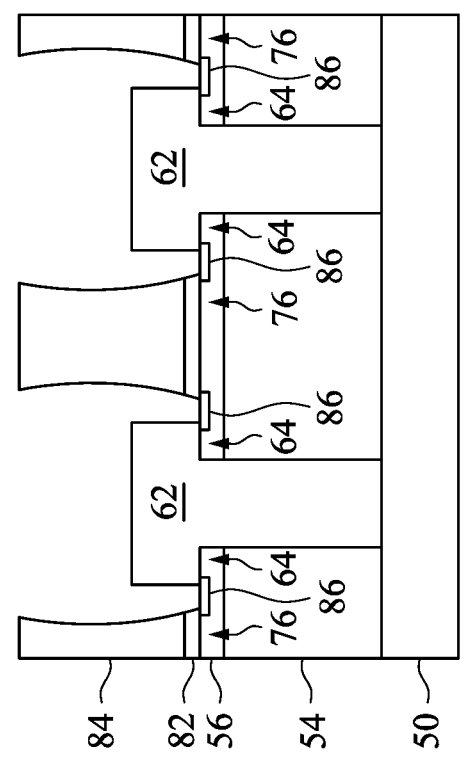
Figure 15B:
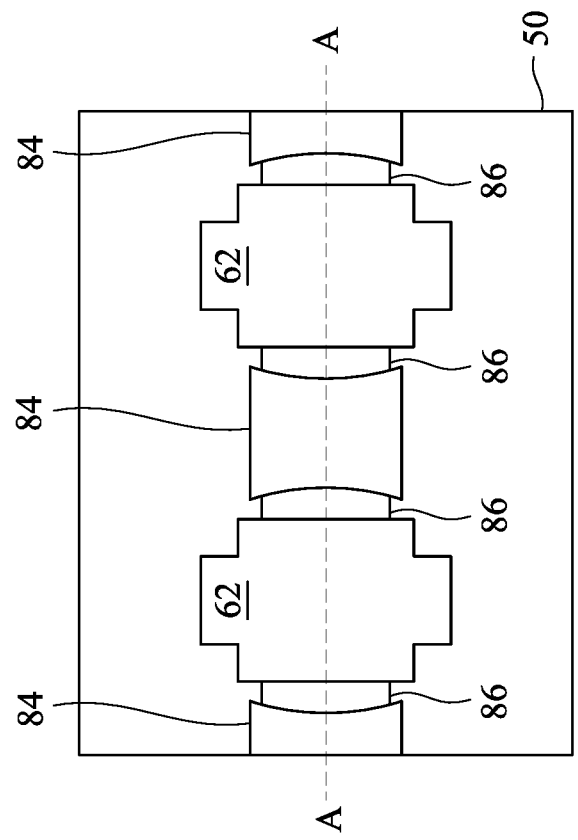

In FIGS. 15A and 15B, source/drain extensions 86 are formed in the low-dimensional layer 56. The source/drain extensions 86 may also be referred to as highly doped extended source/drain regions. The source/drain extensions 86 may be formed by implanting an appropriate impurity (e.g., a p-type or an n-type dopant) in the exposed portions of the low-dimensional layer 56, such as the portions of the low-dimensional layer 56 between the gate structures 80 (see FIG. 13A) and the source/drain contacts 62. Example n-type impurities include phosphorus, arsenic, antimony, and the like, which can be implanted by $TiO_x$ solution doping, Cl solution doping, $SiN_x$ layer doping, or the like. Example p-type impurities include boron, boron-fluoride, indium, and the like, which can be implanted by nitric oxide gas doping, $AuCl_3$ solution doping, $WO_x$ and $MoO_x$ layer doping, or the like. Although separately illustrated, each source/drain region 64 and corresponding source/drain extension 86 may collectively function as a source/drain region.

Figure 16B:
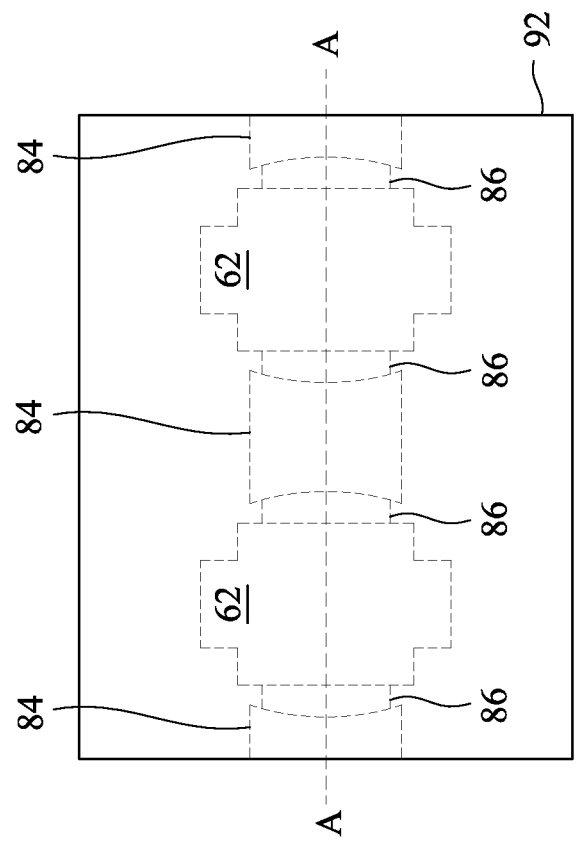
Figure 16A:
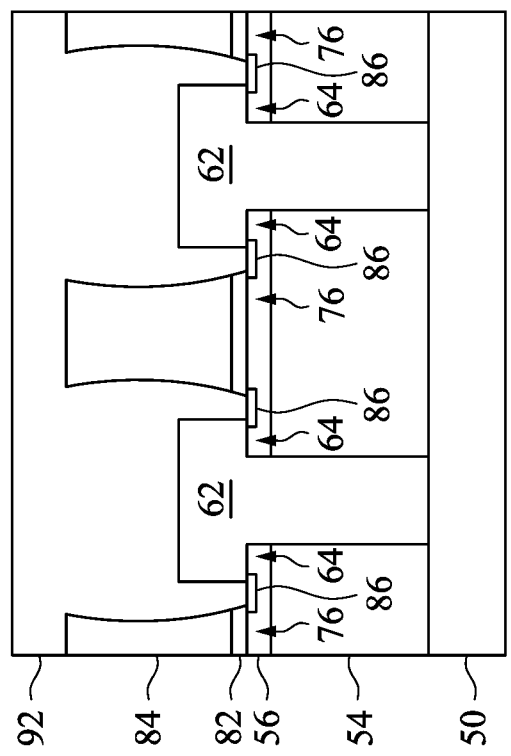

In FIGS. 16A and 16B, a first interlayer dielectric (ILD) layer 92 is deposited over the source/drain contacts 62, the source/drain extensions 86, the gate dielectrics 82, and the gate electrodes 84. The first ILD layer 92 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. For example, the first ILD layer 92 may also be formed of a passivation material, such as carbon doped oxides, extremely low-k dielectrics such as porous carbon doped silicon dioxide, a polymer such as polyimide, solder resist, polybenzoxazole (PBO), a benzocyclobutene (BCB) based polymer, molding compound, the like, or a combination thereof. The passivation material may be formed by spin coating, lamination, a deposition process, the like, or a combination thereof. The passivation material can also be formed of a low-dimensional insulating material with a large bandgap, such as hexagonal Boron Nitride (hBN), which can be grown in a bottom-up manner.

Figure 17A:
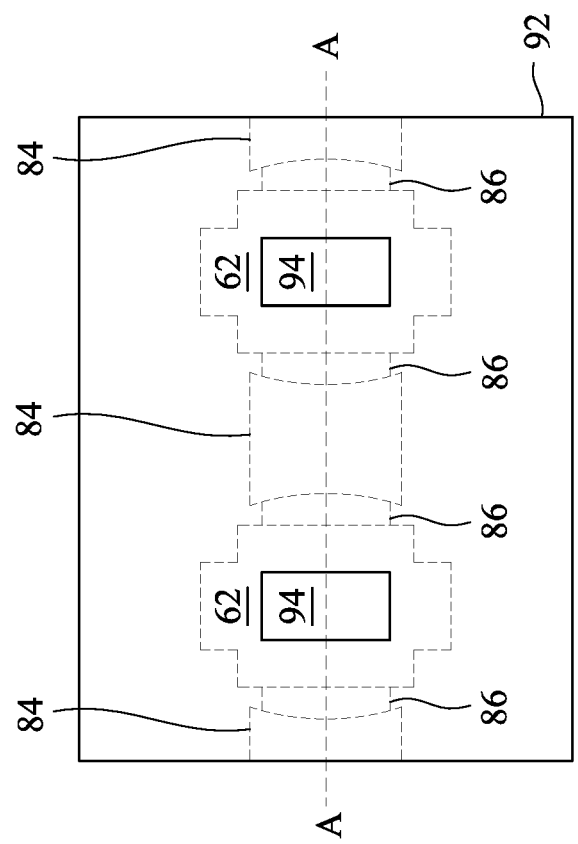
Figure 17B:
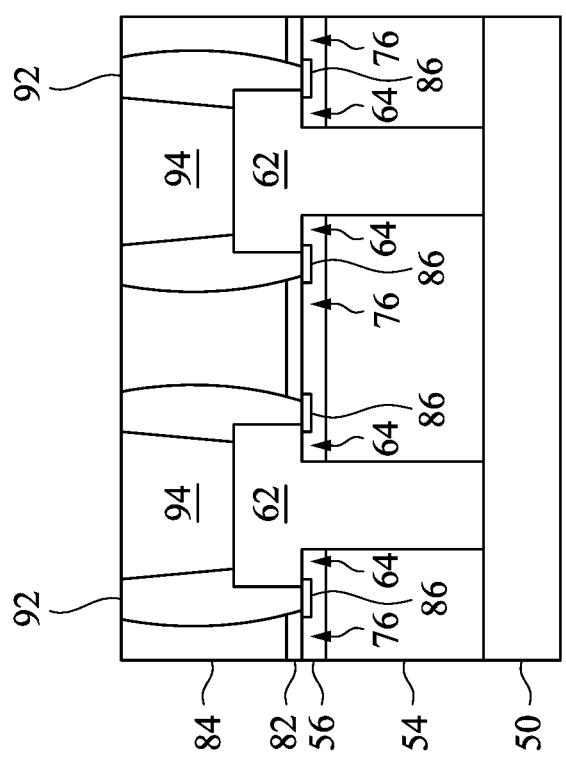
Figure 18D:
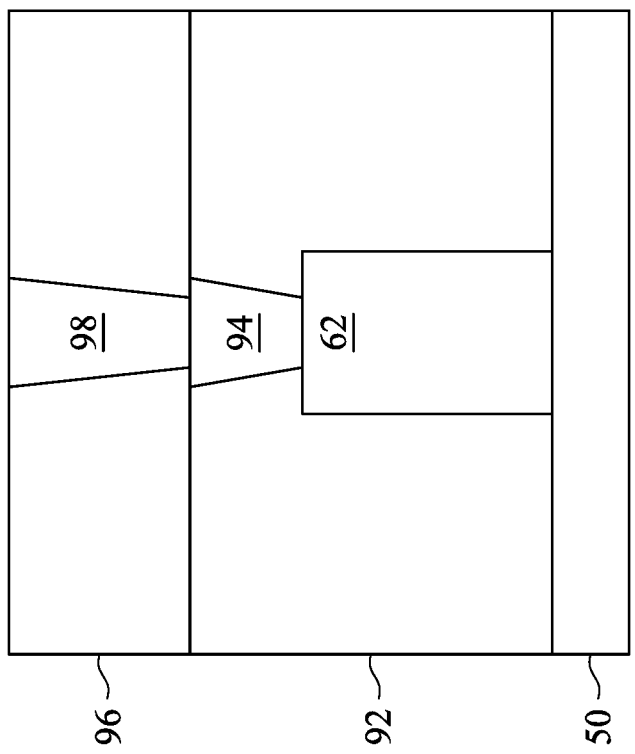
Figure 18C:
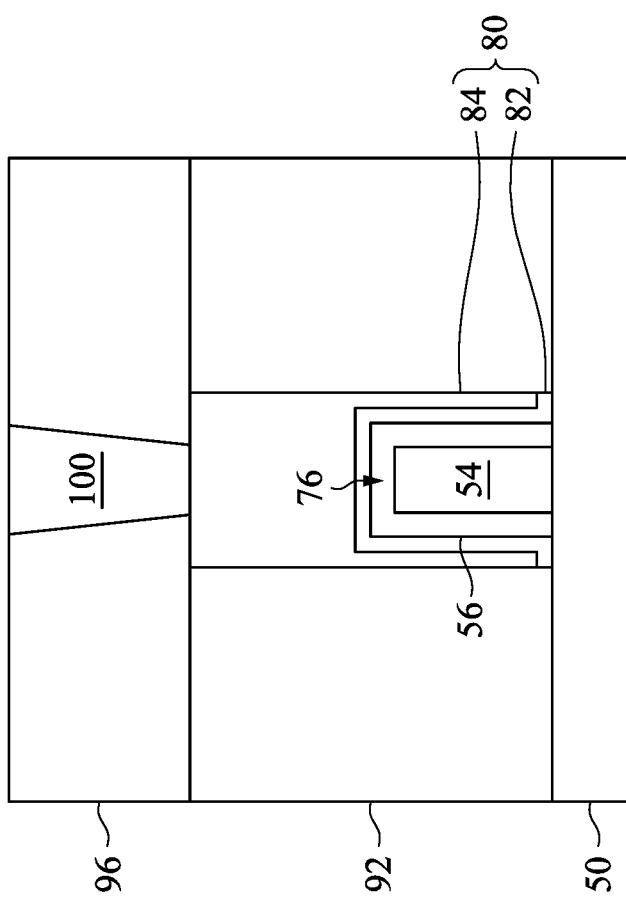
Figure 19B:
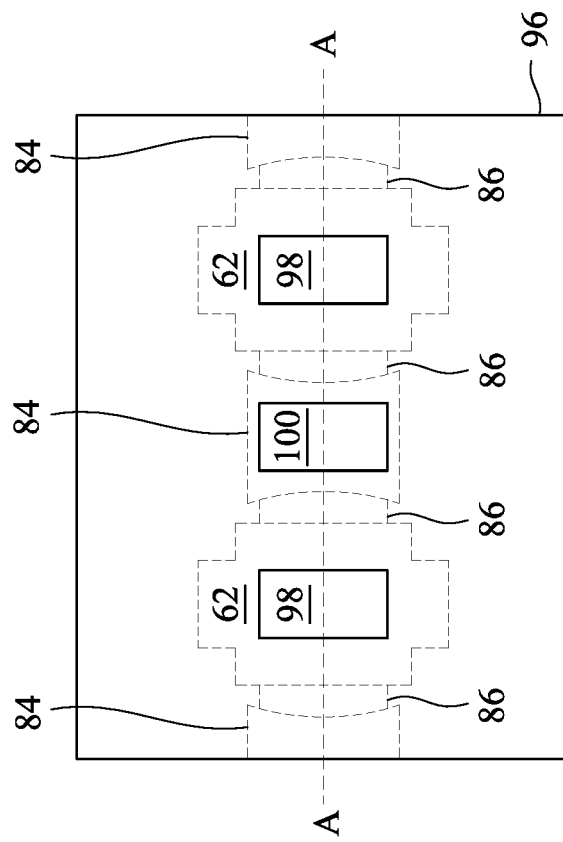
FIGS. 19A through 19D illustrate low-dimensional FinFETs, in accordance with some embodiments.
Figure 19A:
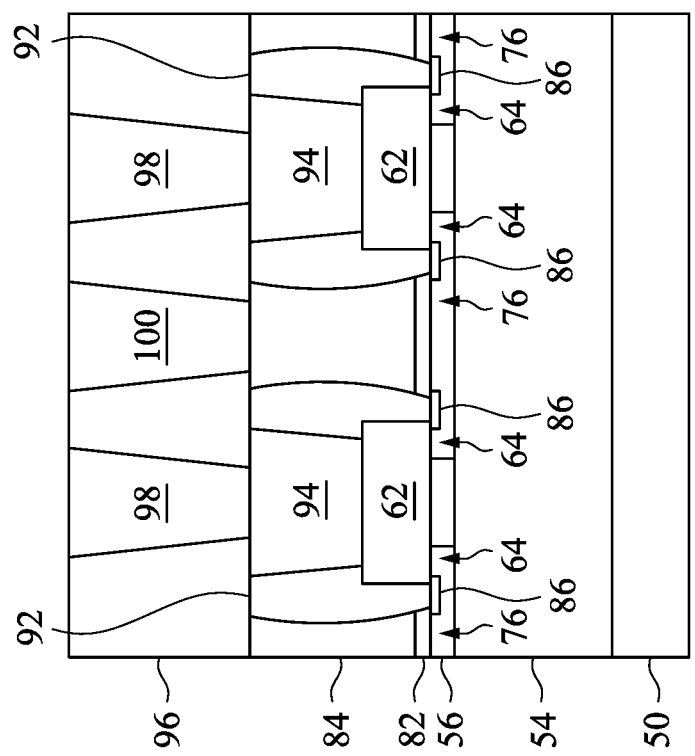
Figure 19D:
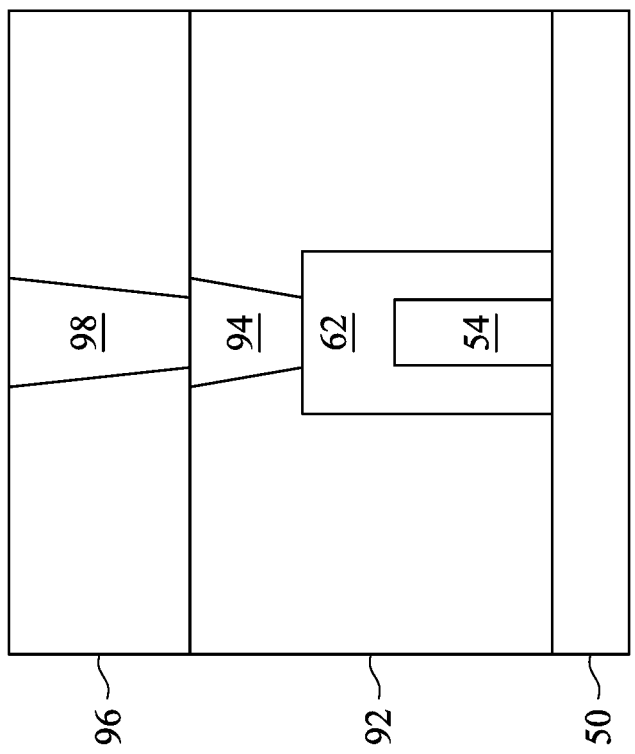
Figure 19C:
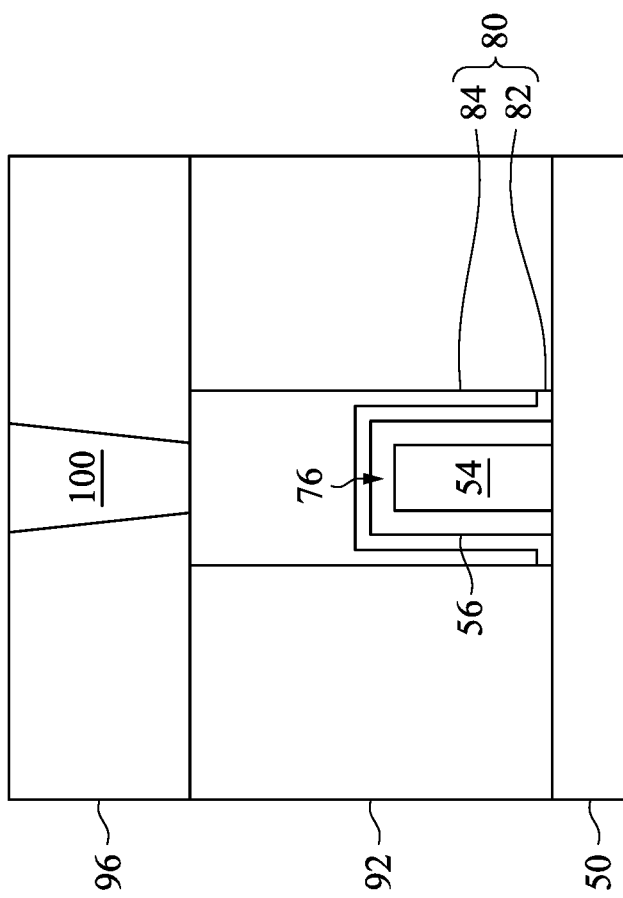
Figure 20B:
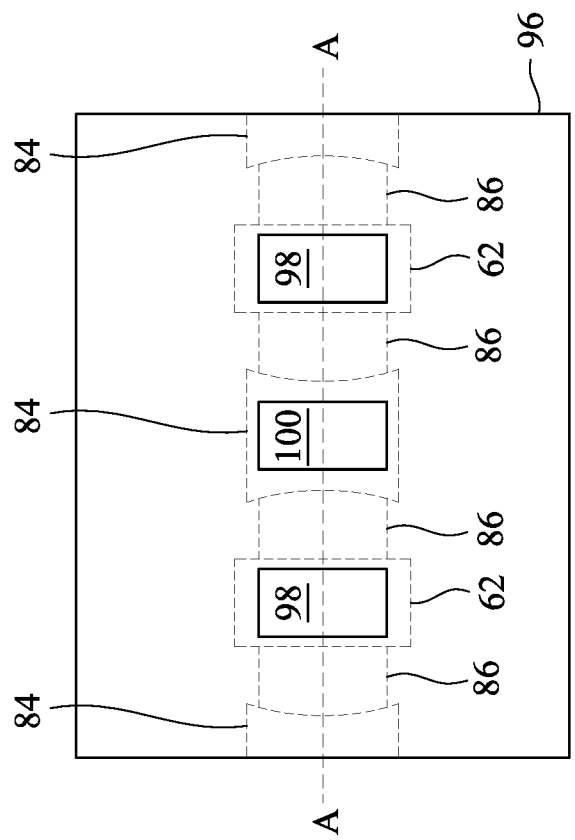
FIGS. 20A through 20D illustrate low-dimensional FinFETs, in accordance with some embodiments.
Figure 20A:
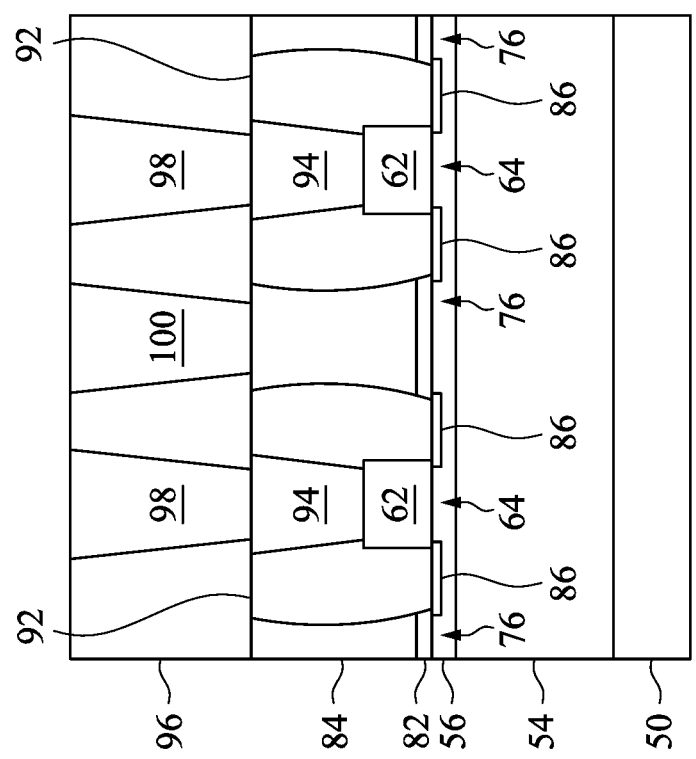
Figure 20D:
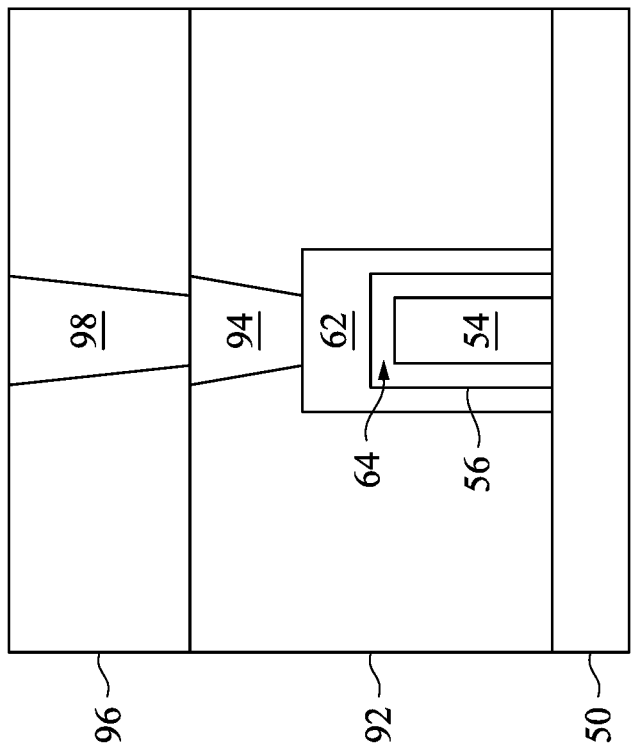
Figure 20C:
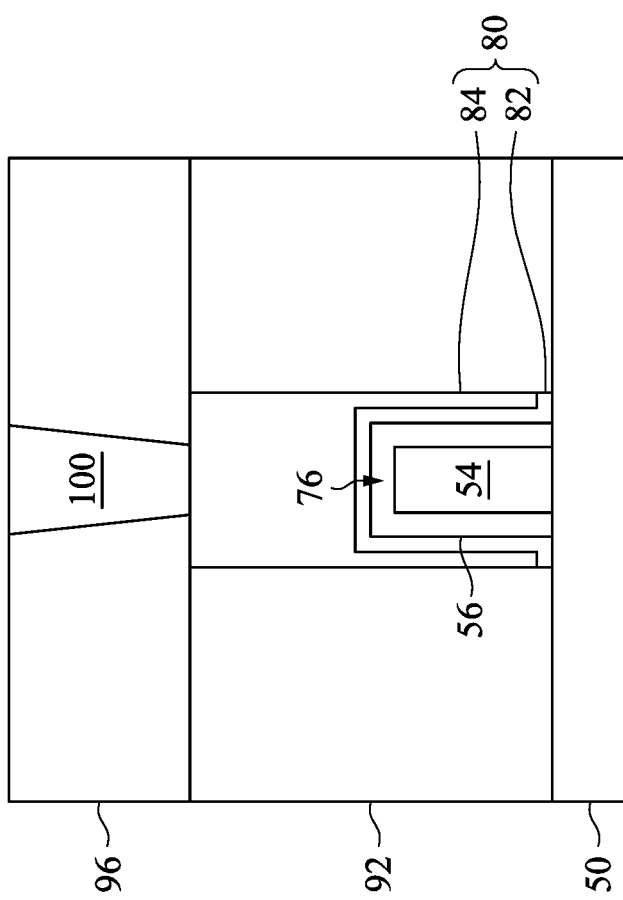
Figure 21A:
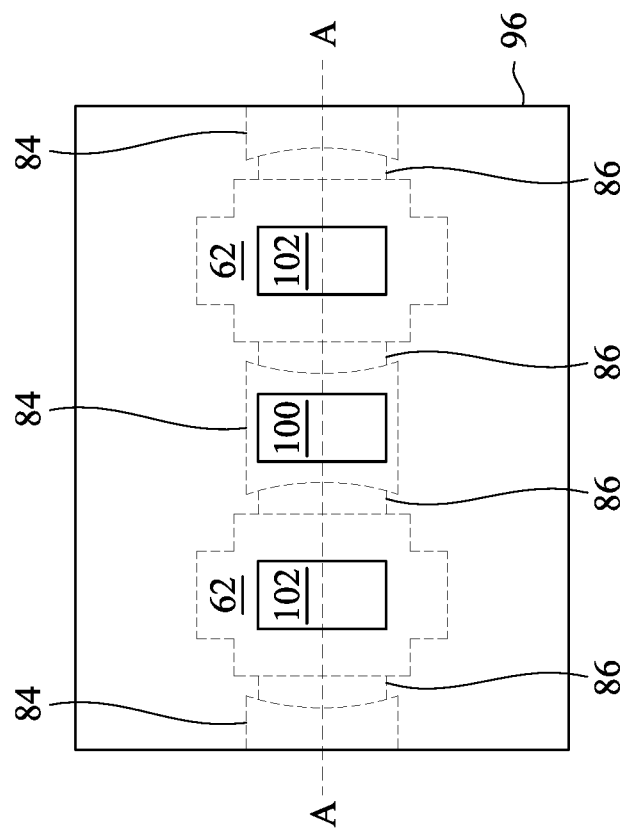
FIGS. 21A through 21D illustrate low-dimensional FinFETs, in accordance with some embodiments.
Figure 21B:
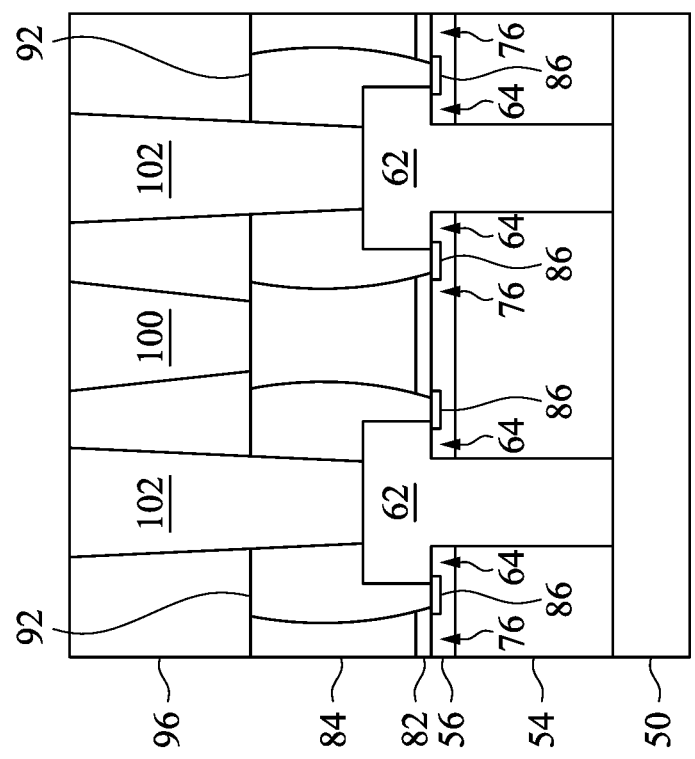
Figure 21D:
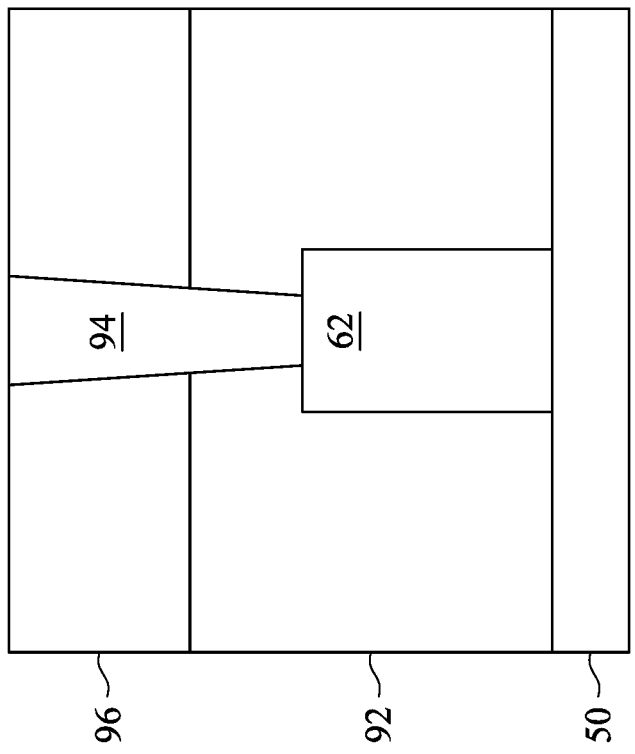
Figure 21C:
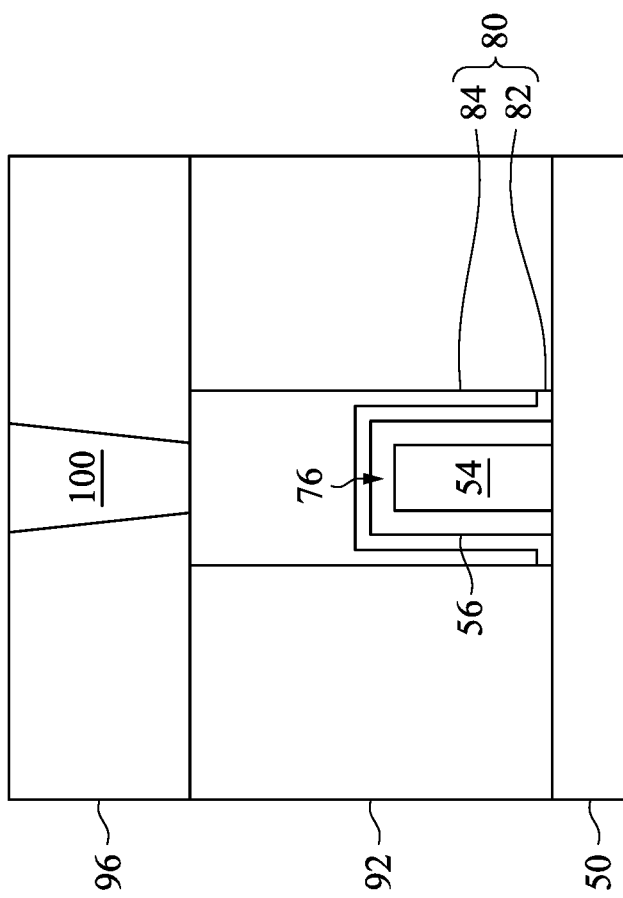

In FIGS. 17A and 17B, second source/drain contacts 94 are formed through the first ILD layer 92 to the source/drain contacts 62. Openings for the second source/drain contacts 94 are formed through the first ILD layer 92. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a top surface of the first ILD layer 92. The remaining liner and conductive material form the second source/drain contacts 94 in the openings. The second source/drain contacts 94 are physically and electrically coupled to the source/drain contacts 62. After formation, the top surfaces of the second source/drain contacts 94 and the gate electrodes 84 are coplanar (within process variations). In some embodiments, an additional planarization process, such as a CMP, is performed to remove excess material of the first ILD layer 92 from top surfaces of the gate electrodes 84 before forming the second source/drain contacts 94. In another embodiment, the planarization process performed when forming the second source/drain contacts 94 also removes excess material of the first ILD layer 92 from top surfaces of the gate electrodes 84.

In FIGS. 18A through 18D, a second ILD layer 96 is deposited over the first ILD layer 92. In some embodiments, the second ILD layer 96 is a flowable film formed by a flowable CVD method. In some embodiments, the second ILD layer 96 is formed of a dielectric material such as PSG, BSG, BPSG, USG, or the like, and may be deposited by any suitable method, such as CVD and PECVD. In some embodiments, an etch stop layer is formed between the first ILD layer 92 and the second ILD layer 96.

Third source/drain contacts 98 and gate contacts 100 are formed, respectively, to the second source/drain contacts 94 and the gate electrodes 84. Openings for the third source/drain contacts 98 and the gate contacts 100 are formed through the second ILD layer 96. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD layer 96. The remaining liner and conductive material form the third source/drain contacts 98 and the gate contacts 100 in the openings. The third source/drain contacts 98 are physically and electrically coupled to the second source/drain contacts 94, and the gate contacts 100 are physically and electrically coupled to the gate electrodes 84. The third source/drain contacts 98 and the gate contacts 100 may be formed in different processes, or may be formed in the same process. Although shown as being formed in the same cross-sections, it should be appreciated that each of the third source/drain contacts 98 and the gate contacts 100 may be formed in different cross-sections, which may avoid shorting of the contacts.

FIGS. 19A through 19D illustrate low-dimensional FinFETs, in accordance with some other embodiments. This embodiment is similar to the embodiment of FIGS. 18A through 18D, except the source/drain contacts 62 are only formed through the low-dimensional layer 56, and are not formed extending into/through the fin 54. For example, this embodiment may be formed when the openings 60 described with respect to FIGS. 7A and 7B are not extended through the fin 54. The source/drain contacts 62 may be formed at a lower cost. In this embodiment, the lower portions the source/drain contacts 62 overly the fin 54.

FIGS. 20A through 20D illustrate low-dimensional FinFETs, in accordance with some other embodiments. This embodiment is similar to the embodiment of FIGS. 18A through 18D, except the source/drain contacts 62 are formed on the low-dimensional layer 56, and do not extend into/through the low-dimensional layer 56. For example, this embodiment may be formed by obtaining a structure similar to that of FIGS. 6A and 6B, and depositing or growing the source/drain contacts 62 in the openings 60 of the mask 58, e.g., directly on the low-dimensional layer 56. The source/drain contacts 62 according to this embodiment can be formed when the low-dimensional layer 56 is formed of a low-dimensional material that does not have structures with ends for connection to the source/drain contacts 62. For example, the low-dimensional layer 56 in this embodiment can be a transition metal dichalcogenide (TMD) layer, a graphene layer, or the like. In this embodiment, an entirety of the source/drain contacts 62 overly the low-dimensional layer 56.

FIGS. 21A through 21D illustrate low-dimensional FinFETs, in accordance with some other embodiments. This embodiment is similar to the embodiment of FIGS. 18A through 18D, except second source/drain contacts 102 are formed extending through both the first ILD layer 92 and the second ILD layer 96. The second source/drain contacts 102 may be formed in a same process as the gate contacts 100. The openings for the second source/drain contacts 102 can be formed through both the first ILD layer 92 and the second ILD layer 96, and the second source/drain contacts 102 can be formed in the openings in a similar manner as that discussed with respect to FIGS. 18A and 18B. In other words, in this embodiment, contact to the source/drain contacts 62 is accomplished by forming a single continuous conductive feature through the first ILD layer 92 and the second ILD layer 96, but in the embodiment of FIGS. 18A through 18D, contact to the source/drain contacts 62 is accomplished by forming separate conductive features through the first ILD layer 92 and the second ILD layer 96. It should be appreciated that similar second source/drain contacts 102 can also be formed in the embodiment of FIGS. 19A through 19D and the embodiment of FIGS. 20A through 20D.

Embodiments may achieve advantages. Forming the source/drain contacts 62 through the low-dimensional layer 56 can increase the contact area, reducing the contact resistance, and also allows the source/drain contacts 62 to connect to ends of carbon nanotubes in the low-dimensional layer 56. The performance of the resulting low-dimensional FinFET may thus be improved. Further, forming the spacers 70 as self-assembled spacers allows the lengths of the resulting gate structures 80 to be controlled in a self-aligned manner. Flexibility in manufacturing may thus be improved.

In an embodiment, a method includes: forming a dielectric fin on a substrate; forming a low-dimensional layer on the dielectric fin; forming a first source/drain contact and a second source/drain contact on the low-dimensional layer; growing a first self-assembled spacer and a second self-assembled spacer on the first source/drain contact and the second source/drain contact, respectively, a channel region of the low-dimensional layer disposed between the first self-assembled spacer and the second self-assembled spacer; forming a gate structure on the channel region; and after forming the gate structure, removing the first self-assembled spacer and the second self-assembled spacer. In some embodiments of the method, forming the low-dimensional layer includes: growing a carbon nanotube network by an immersion process; growing aligned carbon nanotubes by decomposing a carbon-containing precursor; or depositing a plurality of transition metal dichalcogenide (TMD) layers. In some embodiments of the method, forming the gate structure includes: depositing a gate dielectric layer on the first self-assembled spacer, the second self-assembled spacer, and the channel region; depositing a gate electrode layer on the gate dielectric layer; and removing portions of the gate dielectric layer and the gate electrode layer on the first self-assembled spacer and the second self-assembled spacer with an adhesion lithography process. In some embodiments of the method, the adhesion lithography process includes: adhering tape to the gate electrode layer; and peeling the tape off the gate electrode layer by pulling the tape in a direction perpendicular to a major surface of the substrate. In some embodiments of the method, growing the first self-assembled spacer and the second self-assembled spacer includes: growing a self-assembled monolayer of molecules on the first source/drain contact and the second source/drain contact, each of the molecules including a head group, a tail, and an end group, the head group anchored to a surface of one of the first source/drain contact or the second source/drain contact, the tail connecting the head group to the end group. In some embodiments of the method, growing the self-assembled monolayer of the molecules includes: selecting the end group according to a desired length of the gate structure; for each of the molecules: adsorbing the head group on the surface; assembling the tail; and functionalizing a terminal end of the tail with the selected end group. In some embodiments of the method, forming the first source/drain contact and the second source/drain contact includes: forming a photoresist on the low-dimensional layer; exposing the photoresist to a patterned light source; applying a developer to the photoresist to form openings in the photoresist exposing the low-dimensional layer; and forming a conductive material in the openings and on the low-dimensional layer. In some embodiments of the method, forming the first source/drain contact and the second source/drain contact includes: forming a photoresist on the low-dimensional layer; exposing the photoresist to a patterned light source; applying a developer to the photoresist to form openings in the photoresist exposing the low-dimensional layer; etching the low-dimensional layer using the photoresist as an etching mask to extend the openings into the low-dimensional layer; reapplying the developer to the photoresist to widen the openings in the photoresist; and forming a conductive material in the openings in the photoresist and the openings in the low-dimensional layer. In some embodiments of the method, forming the conductive material includes forming the conductive material on the dielectric fin. In some embodiments, the method further includes: etching the dielectric fin using the photoresist as an etching mask to extend the openings into the dielectric fin, where forming the conductive material includes forming the conductive material in the openings in the dielectric fin. In some embodiments of the method, reapplying the developer to the photoresist includes: selecting a duration of time according to a desired length of the channel region; and reapplying the developer to the photoresist for the selected duration of time.

In an embodiment, a device includes: a dielectric fin on a substrate; a low-dimensional layer on the dielectric fin, the low-dimensional layer including a source/drain region and a channel region; a source/drain contact on the source/drain region; and a gate structure on the channel region adjacent the source/drain contact, the gate structure having a first width at a top of the gate structure, a second width at a middle of the gate structure, and a third width at a bottom of the gate structure, the second width being less than each of the first width and the third width. In some embodiments of the device, an entirety of the source/drain contact overlies the low-dimensional layer. In some embodiments of the device, the source/drain contact has a first portion and a second portion, the first portion overlying the low-dimensional layer, the second portion extending through the low-dimensional layer and overlying the dielectric fin, the first portion having a greater width than the second portion. In some embodiments of the device, the source/drain contact has a first portion and a second portion, the first portion overlying the low-dimensional layer, the second portion extending through the low-dimensional layer and the dielectric fin, the first portion having a greater width than the second portion. In some embodiments, the device further includes: a source/drain extension in the low-dimensional layer, the source/drain extension laterally disposed between the source/drain contact and the gate structure.

In an embodiment, a device includes: a dielectric fin on a substrate; a low-dimensional layer on the dielectric fin; a gate dielectric on the low-dimensional layer; a gate electrode on the gate dielectric, the gate electrode having concave sidewalls; and a source/drain contact adjacent the gate electrode and the gate dielectric, the source/drain contact having a first portion and a second portion, the first portion contacting a top surface of the low-dimensional layer, the second portion extending through the low-dimensional layer and contacting a sidewall of the low-dimensional layer, the first portion being wider than the second portion, the source/drain contact electrically connected to the low-dimensional layer.

In some embodiments of the device, the low-dimensional layer is a carbon nanotube layer. In some embodiments of the device, the low-dimensional layer is a transition metal dichalcogenide (TMD) layer. In some embodiments of the device, the gate electrode has a first width at a top of the gate electrode, a second width at a middle of the gate electrode, and a third width at a bottom of the gate electrode, the second width being less than each of the first width and the third width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a dielectric fin on a substrate;
forming a low-dimensional layer on the dielectric fin;
forming a first source/drain contact and a second source/drain contact on the low-dimensional layer;
growing a first self-assembled spacer and a second self-assembled spacer on the first source/drain contact and the second source/drain contact, respectively, a channel region of the low-dimensional layer disposed between the first self-assembled spacer and the second self-assembled spacer;
forming a gate structure on the channel region; and
after forming the gate structure, removing the first self-assembled spacer and the second self-assembled spacer.

2. The method of claim 1, wherein forming the low-dimensional layer comprises:
growing a carbon nanotube network by an immersion process;
growing aligned carbon nanotubes by decomposing a carbon-containing precursor; or
depositing a plurality of transition metal dichalcogenide (TMD) layers.

3. The method of claim 1, wherein forming the gate structure comprises:
depositing a gate dielectric layer on the first self-assembled spacer, the second self-assembled spacer, and the channel region;
depositing a gate electrode layer on the gate dielectric layer; and
removing portions of the gate dielectric layer and the gate electrode layer on the first self-assembled spacer and the second self-assembled spacer with an adhesion lithography process.

4. The method of claim 3, wherein the adhesion lithography process comprises:
adhering tape to the gate electrode layer; and
peeling the tape off the gate electrode layer by pulling the tape in a direction perpendicular to a major surface of the substrate.

5. The method of claim 1, wherein growing the first self-assembled spacer and the second self-assembled spacer comprises:
growing a self-assembled monolayer of molecules on the first source/drain contact and the second source/drain contact, each of the molecules including a head group, a tail, and an end group, the head group anchored to a surface of one of the first source/drain contact or the second source/drain contact, the tail connecting the head group to the end group.

6. The method of claim 5, wherein growing the self-assembled monolayer of the molecules comprises:
selecting the end group according to a desired length of the gate structure;
for each of the molecules:
adsorbing the head group on the surface;
assembling the tail; and
functionalizing a terminal end of the tail with the selected end group.

7. The method of claim 1, wherein forming the first source/drain contact and the second source/drain contact comprises:
forming a photoresist on the low-dimensional layer;
exposing the photoresist to a patterned light source;
applying a developer to the photoresist to form openings in the photoresist exposing the low-dimensional layer; and
forming a conductive material in the openings and on the low-dimensional layer.

8. The method of claim 1, wherein forming the first source/drain contact and the second source/drain contact comprises:
forming a photoresist on the low-dimensional layer;
exposing the photoresist to a patterned light source;
applying a developer to the photoresist to form openings in the photoresist exposing the low-dimensional layer;
etching the low-dimensional layer using the photoresist as an etching mask to extend the openings into the low-dimensional layer;
reapplying the developer to the photoresist to widen the openings in the photoresist; and
forming a conductive material in the openings in the photoresist and the openings in the low-dimensional layer.

9. The method of claim 8, wherein forming the conductive material comprises forming the conductive material on the dielectric fin.

10. The method of claim 8 further comprising:
etching the dielectric fin using the photoresist as an etching mask to extend the openings into the dielectric fin, wherein forming the conductive material comprises forming the conductive material in the openings in the dielectric fin.

11. The method of claim 8, wherein reapplying the developer to the photoresist comprises:
selecting a duration of time according to a desired length of the channel region; and
reapplying the developer to the photoresist for the selected duration of time.

12. A device comprising:
a dielectric fin on a substrate;
a low-dimensional layer on the dielectric fin, the low-dimensional layer comprising a source/drain region and a channel region;
a source/drain contact on the source/drain region; and
a gate structure on the channel region adjacent the source/drain contact, the gate structure having a first width at a top of the gate structure, a second width at a middle of the gate structure, and a third width at a bottom of the gate structure, the second width being less than each of the first width and the third width.

13. The device of claim 12, wherein an entirety of the source/drain contact overlies the low-dimensional layer.

14. The device of claim 12, wherein the source/drain contact has a first portion and a second portion, the first portion overlying the low-dimensional layer, the second portion extending through the low-dimensional layer and overlying the dielectric fin, the first portion having a greater width than the second portion.

15. The device of claim 12, wherein the source/drain contact has a first portion and a second portion, the first portion overlying the low-dimensional layer, the second portion extending through the low-dimensional layer and the dielectric fin, the first portion having a greater width than the second portion.

16. The device of claim 12 further comprising:
a source/drain extension in the low-dimensional layer, the source/drain extension laterally disposed between the source/drain contact and the gate structure.

17. A device comprising:
a dielectric fin on a substrate;
a low-dimensional layer on the dielectric fin;
a gate dielectric on the low-dimensional layer;
a gate electrode on the gate dielectric, the gate electrode having concave sidewalls; and
a source/drain contact adjacent the gate electrode and the gate dielectric, the source/drain contact having a first portion and a second portion, the first portion contacting a top surface of the low-dimensional layer, the second portion extending through the low-dimensional layer and contacting a sidewall of the low-dimensional layer, the first portion being wider than the second portion, the source/drain contact electrically connected to the low-dimensional layer.

18. The device of claim 17, wherein the low-dimensional layer is a carbon nanotube layer.

19. The device of claim 17, wherein the low-dimensional layer is a transition metal dichalcogenide (TMD) layer.

20. The device of claim 17, wherein the gate electrode has a first width at a top of the gate electrode, a second width at a middle of the gate electrode, and a third width at a bottom of the gate electrode, the second width being less than each of the first width and the third width.

* * * * *